US010133645B2

(12) United States Patent
Shapira et al.

(10) Patent No.: US 10,133,645 B2
(45) Date of Patent: Nov. 20, 2018

(54) DATA RECOVERY IN THREE DIMENSIONAL NON-VOLATILE MEMORY ARRAY AFTER WORD LINE SHORT

(71) Applicant: SanDisk Technologies LLC, Plano, TX (US)

(72) Inventors: Ofer Shapira, Tel-Aviv (IL); Idan Alrod, Herzliya (IL); Eran Sharon, Rishon Lezion (IL)

(73) Assignee: SanDisk Technologies LLC, Plano, TX (US)

( * ) Notice: Subject to any disclaimer, the term of this patent is extended or adjusted under 35 U.S.C. 154(b) by 135 days.

(21) Appl. No.: 15/414,442

(22) Filed: Jan. 24, 2017

(65) Prior Publication Data

US 2017/0228299 A1 Aug. 10, 2017

Related U.S. Application Data

(60) Provisional application No. 62/292,797, filed on Feb. 8, 2016.

(51) Int. Cl.
*G06F 11/00* (2006.01)
*G06F 11/20* (2006.01)
(Continued)

(52) U.S. Cl.
CPC .......... *G06F 11/2094* (2013.01); *G06F 3/064* (2013.01); *G06F 3/0619* (2013.01); *G06F 3/0652* (2013.01); *G06F 3/0655* (2013.01); *G06F 3/0665* (2013.01); *G06F 3/0679* (2013.01); *G06F 11/073* (2013.01); *G06F 11/1048* (2013.01); *G06F 11/1068* (2013.01); *G11C 7/1006* (2013.01); *G11C 11/5628* (2013.01); *G11C 11/5635* (2013.01); *G11C 16/0483* (2013.01)

(58) Field of Classification Search
CPC ............... G06F 11/1048; G06F 11/073; G06F 11/1068; G06F 11/1012; G06F 11/1044; G06F 11/108
See application file for complete search history.

(56) References Cited

U.S. PATENT DOCUMENTS 8,902,652 B1 12/2014 Huang et al.
9,514,837 B2 * 12/2016 Shapira .............. G11C 16/3459
(Continued)

*Primary Examiner* — Charles Ehne
(74) *Attorney, Agent, or Firm* — Brinks Gilson & Lione

(57) ABSTRACT

Data is programmed in a respective block of non-volatile three dimensional memory. The block contains a plurality of rows of subblocks, each row having S subblocks. Programming data in the respective block includes successively programming data in individual rows of the respective block. Programming data in each row is completed prior to programming data in a next row. Programming data in a row includes successively programming data in individual subblocks of the row, in a predefined order. The programming of data in each subblock is completed prior to programming data in a next subblock. While programming data in each individual subblock, a number of XOR signatures, sufficient in number to enable recovery from a short circuit that disables two or three word lines, are generated in volatile memory, and then copied to non-volatile memory prior to programming data in a next subblock in the respective block.

18 Claims, 13 Drawing Sheets

Data Storage System 100

(51) Int. Cl.
*G11C 16/04* (2006.01)
*G11C 11/56* (2006.01)
*G06F 3/06* (2006.01)
*G06F 11/07* (2006.01)
*G06F 11/10* (2006.01)
*G11C 7/10* (2006.01)

(56) References Cited

U.S. PATENT DOCUMENTS

| | | | |
|---|---|---|---|
| 2013/0275665 A1* | 10/2013 | Saraswat | G11C 7/04 |
| | | | 711/106 |
| 2015/0092493 A1 | 4/2015 | Costa et al. | |
| 2016/0211035 A1* | 7/2016 | Shapira | G11C 16/3459 |
| 2017/0249207 A1* | 8/2017 | Sharon | G06F 11/1068 |

* cited by examiner

500

---

Programming data in a subset of a respective string in a respective block of the non-volatile three dimensional memory by performing a set of operations having programming a plurality of pages of data in non-volatile memory cells on each word line, in the respective string, in a contiguous set of W word lines in the plurality of word lines of the respective block, including programming N pages of data in the non-volatile memory cells on each word line in the contiguous set of W word lines, where N is a positive integer greater than 1, W is the number of word lines in the contiguous set of word lines, and W has a value greater than 3 ~502

(A)

↓

In conjunction with programming W*N pages of data in non-volatile memory cells on the contiguous set of W word lines, generating in a predefined region of volatile memory D*N XOR signatures, each generated by performing an accumulated XOR operation on W/D pages of the W*N pages programmed in the non-volatile memory cells on the contiguous set of W word lines, wherein D is a positive integer greater than 1 ~504

↓

Prior to programming data in any string, other than the respective string, of the respective block ~504

In response to detecting a short between M word lines in the contiguous set of W word lines, where M is a positive integer no greater than D, generating, using M*N XOR signatures of the D*N XOR signatures, recovery data corresponding to M*N pages of data programmed on the M word lines ~506

↓ storing the D*N XOR signatures in an assigned portion of non-volatile memory that is distinct from the respective block of the non-volatile three dimensional memory ~508

602 — Programming data in a respective block of the plurality of blocks of the non-volatile three dimensional memory, wherein the respective block contains a plurality of rows of subblocks, each row having S subblocks where S is the number of strings in the respective block and the S subblocks of the row have a predefined order in which the subblocks are programmed with data, each row of the plurality of rows including a contiguous subset of the plurality of word lines in the respective block that is distinct from the contiguous subset of the plurality of word lines in every other row of the plurality of rows; and wherein at least two rows of the plurality of rows each includes a contiguous set of at least four word lines of the plurality of word lines in the respective block

604 — Successively programming data in individual rows of the plurality of rows of the respective block, wherein the programming of data in each row is completed prior to programming data in a next row of the plurality of rows of the respective block

606 — Successively programming data in individual subblocks of the S subblocks of the respective row, in the predefined order; wherein the programming of data in each subblock of the S subblocks is completed prior to programming data in a next subblock of the S subblocks of the respective row

608 — While programming data in each individual subblock of the S subblocks of the respective row, generating D*N XOR signatures for the individual subblock, where N is a positive integer greater than 1, each XOR signature generated by performing an accumulated XOR operation on a predefined set of pages in the individual subblock, and in conjunction with completing the programming of data in the individual subblock, storing the D*N XOR signatures in an assigned portion of non-volatile memory

```
┌──────────────────────────────────────────────────────────────────┐
│ Programming N pages of data on each word line of the respective  │──610
│ subblock, and in response to detecting a short between M word lines │
│ in the respective subblock, where M is a positive integer no greater │
│ than D, generating, using M*N XOR signatures of the D*N XOR       │
│ signatures generated for the respective subblock, recovery data  │
│ corresponding to M*N pages of data programmed on the M word lines │
└──────────────────────────────────────────────────────────────────┘
```

```
┌──────────────────────────────────────────────────────────────────┐
│ Programming N pages of data on each word line of the respective  │──612
│ subblock, and in response to detecting a short between two word lines │
│ in the respective subblock, generating, using 2N of the XOR       │
│ signatures generated for the respective subblock, recovery data  │
│ corresponding to 2N pages of data programmed on the two word lines │
└──────────────────────────────────────────────────────────────────┘
```

Figure 6B

DATA RECOVERY IN THREE DIMENSIONAL NON-VOLATILE MEMORY ARRAY AFTER WORD LINE SHORT

RELATED APPLICATIONS

This application claims priority to U.S. Provisional Patent Application No. 62/292,797, filed Feb. 8, 2016, which is hereby incorporated by reference in its entirety.

TECHNICAL FIELD

The disclosed embodiments relate generally to non-volatile memory systems, and in particular, to data recovery in a storage device (e.g., comprising one or more flash memory devices).

BACKGROUND

This application relates to the operation of re-programmable nonvolatile memory systems such as semiconductor flash memory which record data using charge stored in charge storage elements of memory cells and to methods of operating such memory systems.

Semiconductor memory, including flash memory, may be arranged in a multi-level cell memory (MLC) array. In some configurations, the MLC is structured in a three dimensional array with orthogonal word lines, strings, and bit lines.

One common problem in three dimensional (3D) arrays of flash memory is that such arrays are susceptible to word line to word line short circuits during write operations (sometimes called programming or data programming operations), in which case the storage elements on those word lines no longer store data, or any data stored in those storage elements is non-recoverable from those storage elements. Moreover, such word line to word line short circuits often occur in 3D flash memory device during normal use, despite the memory devices having passed production quality testing.

Data recovery from word line to word line short circuits and other word line failures typically requires a significant amount of volatile memory (sometimes called a buffer) to temporarily store XOR signatures or other data recovery or error correction information while data is being written to the three dimensional memory array. It would therefore be desirable to have a data recovery mechanism, for recovering from word line to word line short circuits and other word line failures, that uses less volatile memory without sacrificing the ability to recover data.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various embodiments are used to enable data recovery in a three dimensional non-volatile memory array after a word line to word line short circuit. XOR signatures are generated while data is written to a respective block of a three dimensional non-volatile memory array. The XOR signatures can be used to recover data lost due to word line short circuits that occur while data is written to the block.

The block includes a plurality of rows of subblocks, each row having S subblocks where S is the number of strings in the respective block and the S subblocks of the row have a predefined order in which the subblocks are programmed with data. Each row of the plurality of rows includes a contiguous subset of the plurality of word lines in the respective block that is distinct from the contiguous subset of the plurality of word lines in every other row of the plurality of rows. At least two rows of the plurality of rows each includes a contiguous set of at least four word lines of the plurality of word lines in the respective block. A set of D*N XOR signatures are generated, and stored in volatile memory, while data is written to a single subblock of the current row to which data is being written, where D is the maximum number of shorted word lines for which data can be recovered, and N is the number of pages of data written to each word line of the subblock. When programming of the subblock is completed, the D*N XOR signatures are copied from volatile memory to a table in non-volatile memory, the D*N XOR signatures in volatile memory are reset to an initial state (e.g., all zeros), and then a new set of D*N XOR signatures is generated and stored in volatile memory while data is written to the next subblock of the current row of the block.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

FIGS. 5A-5E illustrate a flowchart representation of a method of programming data in a respective block of a three dimensional non-volatile memory array, in accordance with some embodiments.

FIGS. 6A-6B illustrate a flowchart representing a method of programming data in a respective block of a three dimensional non-volatile memory array, in accordance with some embodiments.

Figure 1:
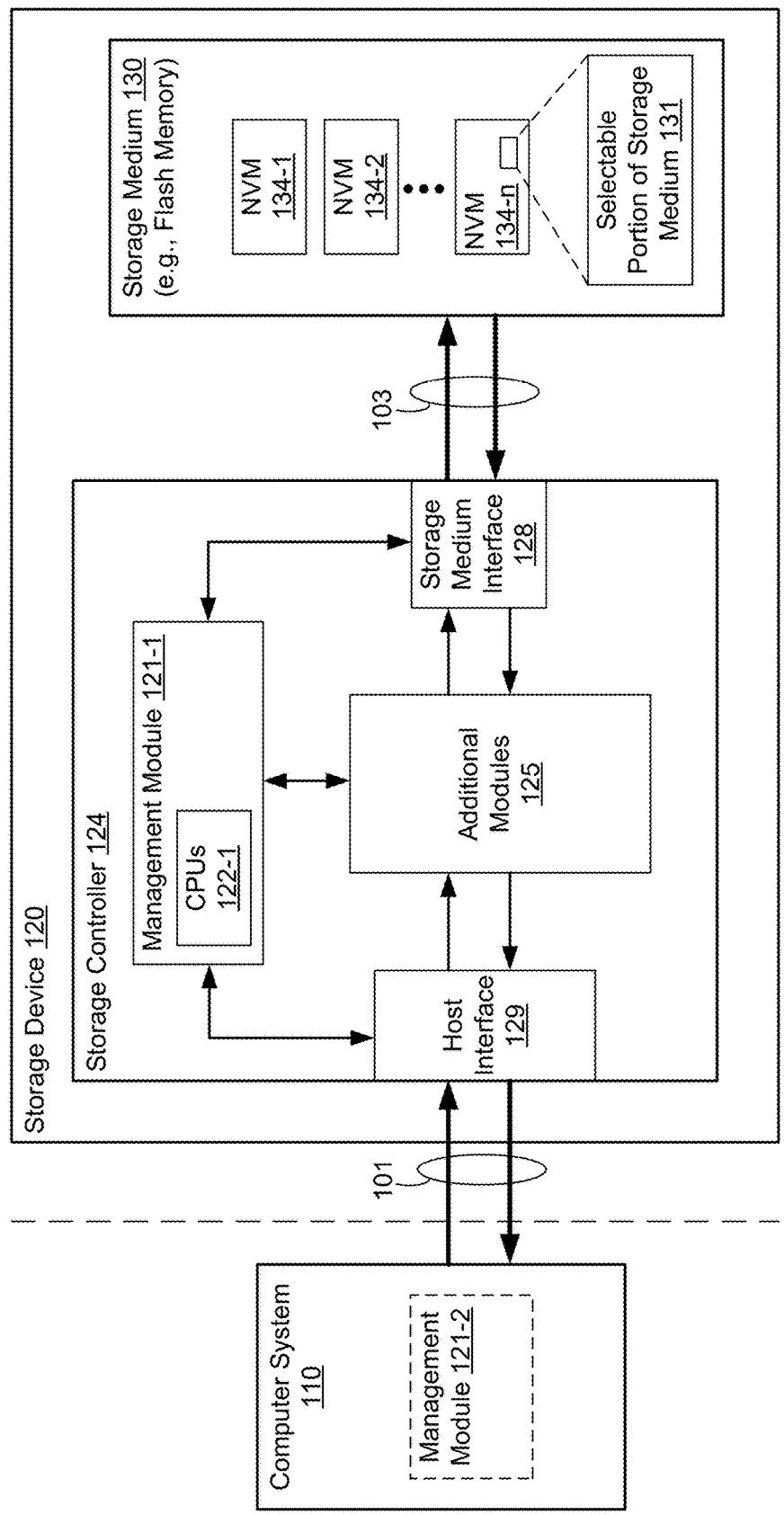
FIG. 1 is a block diagram illustrating an implementation of a data storage system, in accordance with some embodiments.

In accordance with common practice the various features illustrated in the drawings may not be drawn to scale.

Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to program data in a respective block of a three dimensional non-volatile memory array, and to recover data in response to a word line to word line short circuit that occurs while programming data in the respective block or other word line failure. In addition to word line shorts, word line failures may stem from a phenomenon called "broken word line," which inhibits control voltages from propagating well through the control gates of the memory cells on a word line plate. Furthermore, two word lines can fail in different planes, for reasons that may or may not be related. For example, two word lines may fail together if they share a word line driver circuit that has failed.

(A1) More specifically, some embodiments include a method of data recovery in a storage device having non-volatile memory, including a non-volatile three dimensional memory having a plurality of blocks, each block including a plurality of strings, a plurality of word lines and a plurality of bit lines. The method includes programming data in a subset of a respective string in a respective block of the non-volatile three dimensional memory by performing a set of operations that includes: (1) programming a plurality of pages of data in non-volatile memory cells on each word line, in the respective string, in a contiguous set of W word lines in the plurality of word lines of the respective block, including programming N pages of data in the non-volatile memory cells on each word line in the contiguous set of W word lines, where N is a positive integer greater than 1, W is the number of word lines in the contiguous set of word lines, and W has a value greater than 3, and (2) in conjunction with programming W*N pages of data in non-volatile memory cells on the contiguous set of W word lines, generating in a predefined region of volatile memory D*N XOR signatures, each generated by performing an accumulated XOR operation on W/D pages of the W*N pages programmed in the non-volatile memory cells on the contiguous set of W word lines, wherein D is a positive integer greater than 1. Prior to programming data in any string, other than the respective string, of the respective block and in response to detecting a short between M word lines in the contiguous set of W word lines, where M is a positive integer no greater than D, generating, using M*N XOR signatures of the D*N XOR signatures, recovery data corresponding to M*N pages of data programmed on the M word lines. Finally, the method stores the D*N XOR signatures in an assigned portion of non-volatile memory that is distinct from the respective block of the non-volatile three dimensional memory.

(A2) In some embodiments, the method of A1 further includes (1) prior to programming data in any string, other than the respective string, of the respective block, erasing the D*N XOR signatures in the predefined region of volatile memory, and (2) while programming W*N pages of data in a next string of the respective block, in said contiguous set of W word lines, generating in the predefined region of volatile memory a next set of D*N XOR signatures for data stored in the next string of the respective block, in said contiguous set of W word lines.

(A3) In some embodiments of the method of any of A1-A2, the contiguous set of W word lines is a first contiguous set of W word lines in the plurality of word lines, and the plurality of word lines includes a second contiguous set of W word lines adjacent the first contiguous set of W word lines. Additionally, the subset of the respective string in a respective block is a first subset, and a second subset of the respective string in the respective block corresponds to the second contiguous set of W word lines. Further, the method includes programming data in the second subset of the respective string in the respective block of the non-volatile three dimensional memory after (A) programming data in the first subset of the respective string in the respective block and (B) programming data in a respective first subset of at least one string, other than the respective string, of the respective block.

(A4) In some embodiments of the method of A3, the D*N XOR signatures stored in the assigned portion of non-volatile memory include a first set of D*N XOR signatures for the respective string of the respective block. The method further includes, in response to detecting a short between a first word line of the second contiguous set of W word lines and a last word line of the first contiguous set of W word lines: (1) retrieving at least 1N of the first set of D*N XOR signatures from the assigned portion of non-volatile memory, and (2) generating, using the retrieved at least 1N XOR signatures, recovery data corresponding to N pages of data programmed in non-volatile memory cells on the last word line of the first subset of the respective string.

(A5) In some embodiments of the method of any of A4, programming data in the second subset of the respective string in the respective block of the non-volatile three dimensional memory includes generating in the predefined region of volatile memory a second set of D*N XOR signatures, each generated by performing an accumulated XOR operation on W/D pages of the W*N pages programmed in non-volatile memory cells on the second contiguous set of W word lines. The method further includes, in response to detecting the short between the first word line of the second contiguous set of W word lines and the last word line of the first contiguous set of W word lines, generating, using at least 1N of the second set of D*N XOR signatures, recovery data corresponding to N pages of data programmed on the first word line of the second subset of the respective string.

(A6) In some embodiments of the method of any of A1-A5, the respective block contains a plurality of rows of subblocks, each row having S subblocks where S is the number of strings in the respective block and the S subblocks of the row have a predefined order in which the subblocks are programmed with data, each row of the plurality of rows including a contiguous subset of the plurality of word lines in the respective block that is distinct from the contiguous subset of the plurality of word lines in every other row of the plurality of rows; and wherein at least two rows of the plurality of rows each includes at least four word lines of the plurality of word lines in the respective block. The method further includes successively programming data in individual rows of the plurality of rows of the respective block, wherein the programming of data in each row is completed prior to programming data in a next row of the plurality of rows of the respective block. The programming data in a respective row of the respective block includes successively programming data in individual subblocks of the S subblocks of a respective row, in the predefined order. Furthermore, while programming data in each individual subblock of the S subblocks of the respective row, the method includes generating D*N XOR signatures, each XOR signature generated by performing an accumulated XOR operation on a predefined set of pages in the individual subblock, and in conjunction with completing the programming of data in the individual subblock, storing the D*N XOR signatures in an assigned portion of non-volatile memory.

(B1) In another aspect, a method provides for data recovery in a storage device having non-volatile memory, including a non-volatile three dimensional memory having a plurality of blocks, each block including a plurality of strings, a plurality of word lines and a plurality of bit lines. The method includes programming data in a respective block of the plurality of blocks of the non-volatile three dimensional memory. The respective block contains a plurality of rows of subblocks, each row having S subblocks where S is the number of strings in the respective block and the S subblocks of the row have a predefined order in which the subblocks are programmed with data. Each row of the plurality of rows includes a contiguous subset of the plurality of word lines in the respective block that is distinct from the contiguous subset of the plurality of word lines in every other row of the plurality of rows. At least two rows of the plurality of rows each includes a contiguous set of at least four word lines of the plurality of word lines in the respective block. Programming data in the respective block includes successively programming data in individual rows of the plurality of rows of the respective block, wherein the programming of data in each row is completed prior to programming data in a next row of the plurality of rows of the respective block. Programming data in a respective row of the respective block includes (1) successively programming data in individual subblocks of the S subblocks of the respective row, in the predefined order; wherein the programming of data in each subblock of the S subblocks is completed prior to programming data in a next subblock of the S subblocks of the respective row, and (2) while programming data in each individual subblock of the S subblocks of the respective row, generating D*N XOR signatures for the individual subblock, where N is a positive integer greater than 1, each XOR signature generated by performing an accumulated XOR operation on a predefined set of pages in the individual subblock, and in conjunction with completing the programming of data in the individual subblock, storing the D*N XOR signatures in an assigned portion of non-volatile memory.

(B2) In some embodiments of the method of B 1, the method further includes, while programming data in a respective subblock, programming N pages of data on each word line of the respective subblock, and in response to detecting a short between M word lines in the respective subblock, where M is a positive integer no greater than D, generating, using M*N XOR signatures of the D*N XOR signatures generated for the respective subblock, recovery data corresponding to M*N pages of data programmed on the M word lines.

(B3) In some embodiments of the method of any of B1-B2, the method further includes, while programming data in a respective subblock, programming N pages of data on each word line of the respective subblock, and in response to detecting a short between two word lines in the respective subblock, generating, using 2N of the XOR signatures generated for the respective subblock, recovery data corresponding to 2N pages of data programmed on the two word lines.

(B4) In another aspect, a storage device includes non-volatile memory, including a non-volatile three dimensional memory having a plurality of blocks, one or more processors, and controller memory storing one or more programs, which when executed by the one or more processors cause the storage device to perform operations including programming data in a subset of a respective string in a respective block of the non-volatile three dimensional memory by performing a set of operations. The set of operations includes programming a plurality of pages of data in non-volatile memory cells on each word line, in the respective string, in a contiguous set of W word lines in the plurality of word lines of the respective block, including programming N pages of data in the non-volatile memory cells on each word line in the contiguous set of W word lines, where N is a positive integer greater than 1, W is the number of word lines in the contiguous set of word lines, and W has a value greater than 3. In conjunction with programming W*N pages of data in non-volatile memory cells on the contiguous set of W word lines, generating in a predefined region of volatile memory D*N XOR signatures, each generated by performing an accumulated XOR operation on W/D pages of the W*N pages programmed in the non-volatile memory cells on the contiguous set of W word lines, wherein D is a positive integer greater than 1. Prior to programming data in any string, other than the respective string, of the respective block, and in response to detecting a short between D word lines in the contiguous set of W word lines, the set of operations includes generating. using the D*N XOR signatures, recovery data corresponding to D*N pages of data programmed on the D word lines. Furthermore, the method includes, prior to programming data in any string, other than the respective string, of the respective block, storing the D*N XOR signatures in an assigned portion of the non-volatile three dimensional memory that is distinct from the respective block of the non-volatile three dimensional memory.

(B5) In some embodiments of the storage device of B4, the one or more programs include instructions that when executed by the one or more processors cause the storage system to perform the method of any of A1 to A6 and B1 to B3.

(B6) In yet another aspect, a non-transitory computer-readable storage medium stores one or more programs configured for execution by one or more processors of a storage device having non-volatile memory, including a non-volatile three dimensional memory having a plurality of blocks, the one or more programs including instructions for causing the storage device to perform the method of any one of A1 to A6 and B1 to B3.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a block diagram illustrating an implementation of a data storage system 100, in accordance with some embodiments. While some example features are illustrated, various other features have not been illustrated for the sake of brevity and so as not to obscure pertinent aspects of the example embodiments disclosed herein. To that end, as a non-limiting example, data storage system 100 includes a storage device 120 (also sometimes called an information storage device, or a data storage device, or a memory device), which includes a storage controller 124 and a storage medium 130, and is used in conjunction with or includes a computer system 110 (e.g., a host system or a host computer). In some embodiments, storage medium 130 is a single flash memory device while in other embodiments storage medium 130 includes a plurality of flash memory devices. In some embodiments, storage medium 130 is NAND-type flash memory or NOR-type flash memory. In some embodiments, storage medium 130 includes one or more three-dimensional (3D) memory devices. In some embodiments, the memory cells of storage medium 130 are configured to store two or three bits per memory cell. Further, in some embodiments, storage controller 124 is a solid-state drive (SSD) controller. However, other types of storage media may be included in accordance with aspects of a wide variety of embodiments (e.g., PCRAM, ReRAM, STT-RAM, etc.). In some embodiments, a flash memory device includes one or more flash memory die, one or more flash memory packages, one or more flash memory channels or the like. In some embodiments, data storage system 100 includes one or more storage devices 120.

Computer system 110 is coupled to storage controller 124 through data connections 101. However, in some embodiments computer system 110 includes storage controller 124, or a portion of storage controller 124, as a component and/or as a subsystem. For example, in some embodiments, some or all of the functionality of storage controller 124 is implemented by software executed on computer system 110. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host, host system, client, or client system. In some embodiments, computer system 110 is a server system, such as a server system in a data center. In some embodiments, computer system 110 includes one or more processors, one or more types of memory, a display and/or other user interface components such as a keyboard, a touch-screen display, a mouse, a track-pad, a digital camera, and/or any number of supplemental I/O devices to add functionality to computer system 110. In some embodiments, computer system 110 does not have a display and other user interface components.

Storage medium 130 is coupled to storage controller 124 through connections 103. Connections 103 are sometimes called data connections, but typically convey commands in addition to data, and optionally convey metadata, error correction information and/or other information in addition to data values to be stored in storage medium 130 and data values read from storage medium 130. In some embodiments, however, storage controller 124 and storage medium 130 are included in the same device (i.e., an integrated device) as components thereof. Furthermore, in some embodiments, storage controller 124 and storage medium 130 are embedded in a host device (e.g., computer system 110), such as a mobile device, tablet, other computer or computer controlled device, and the methods described herein are performed, at least in part, by the embedded storage controller. Storage medium 130 may include any number (i.e., one or more) of memory devices (e.g., NVM 134-1, NVM 134-2 through NVM 134-n) including, without limitation, persistent memory or non-volatile semiconductor memory devices, such as flash memory device(s). For example, flash memory device(s) can be configured for enterprise storage suitable for applications such as cloud computing, for database applications, primary and/or secondary storage, or for caching data stored (or to be stored) in secondary storage, such as hard disk drives. Additionally and/or alternatively, flash memory device(s) can also be configured for relatively smaller-scale applications such as personal flash drives or hard-disk replacements for personal, laptop, and tablet computers.

Memory devices (e.g., NVM 134-1, NVM 134-2, etc.) of storage medium 130 include addressable and individually selectable blocks, such as selectable portion 131 of storage medium 130 (also referred to herein as selected portion 131). In some embodiments, the individually selectable blocks (sometimes called erase blocks) are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for writing data to or reading data from the flash memory device.

In some embodiments, storage controller 124 includes a management module 121-1, a host interface 129, a storage medium Interface 128, and additional module(s) 125. Storage controller 124 may include various additional features that have not been illustrated for the sake of brevity and so as not to obscure pertinent features of the example embodiments disclosed herein, and a different arrangement of features may be possible. Host interface 129 provides an interface to computer system 110 through data connections 101. Host interface 129 typically includes an input buffer and output buffer, not shown. Similarly, storage medium Interface 128 provides an interface to storage medium 130 though connections 103. In some embodiments, storage medium Interface 128 includes read and write circuitry, including circuitry capable of providing reading signals to storage medium 130 (e.g., reading threshold voltages for NAND-type flash memory).

In some embodiments, management module 121-1 includes one or more processing units 122-1 (sometimes herein called CPUs, processors, or hardware processors, and sometimes implemented using microprocessors, microcontrollers, or the like) configured to execute instructions in one or more programs (e.g., in management module 121-1). In some embodiments, the one or more CPUs 122-1 are shared by one or more components within, and in some cases, beyond the function of storage controller 124. Management module 121-1 is coupled to host interface 129, additional module(s) 125 and storage medium Interface 128 in order to coordinate the operation of these components. In some embodiments, one or more modules of management module 121-1 are implemented in management module 121-2 of computer system 110. In some embodiments, one or more processors of computer system 110 (not shown) are configured to execute instructions in one or more programs (e.g., in management module 121-2). Management module 121-2 is coupled to storage device 120 in order to manage the operation of storage device 120.

In some embodiments, additional module(s) 125 include an error control module, provided to limit the number of uncorrectable errors inadvertently introduced into data during writes to memory or reads from memory. In some embodiments, the error control module is executed in software by the one or more CPUs 122-1 of management module 121-1, and, in other embodiments, the error control module is implemented in whole or in part using special purpose circuitry to perform data encoding and decoding functions. To that end, in some embodiments, the error control module includes an encoder and a decoder. The encoder encodes data by applying an error control code to produce a codeword, which is subsequently stored in storage medium 130.

When the encoded data (e.g., one or more codewords) is read from storage medium 130, the decoder applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, an input buffer typically receives data to be stored in storage medium 130 from computer system 110. The data held in the input buffer is made available to the encoder, which encodes the data to produce one or more codewords. The one or more codewords are made available to storage medium interface 128, which transfers the one or more codewords to storage medium 130 in a manner dependent on the type of storage medium being utilized.

A read operation is initiated when computer system (host) 110 sends one or more host read commands (e.g., via data connections 101) to storage controller 124 requesting data from storage medium 130. Storage controller 124 sends one or more read access commands to storage medium 130, via storage medium interface 128, to obtain raw read data in accordance with memory locations (addresses) specified by the one or more host read commands. Storage medium interface 128 provides the raw read data (e.g., comprising one or more codewords) to the decoder. If the decoding is successful, the decoded data is provided to an output buffer, where the decoded data is made available to computer system 110. In some embodiments, if the decoding is not successful, storage controller 120 may resort to a number of remedial actions or provide an indication of an irresolvable error condition.

Figure 2:
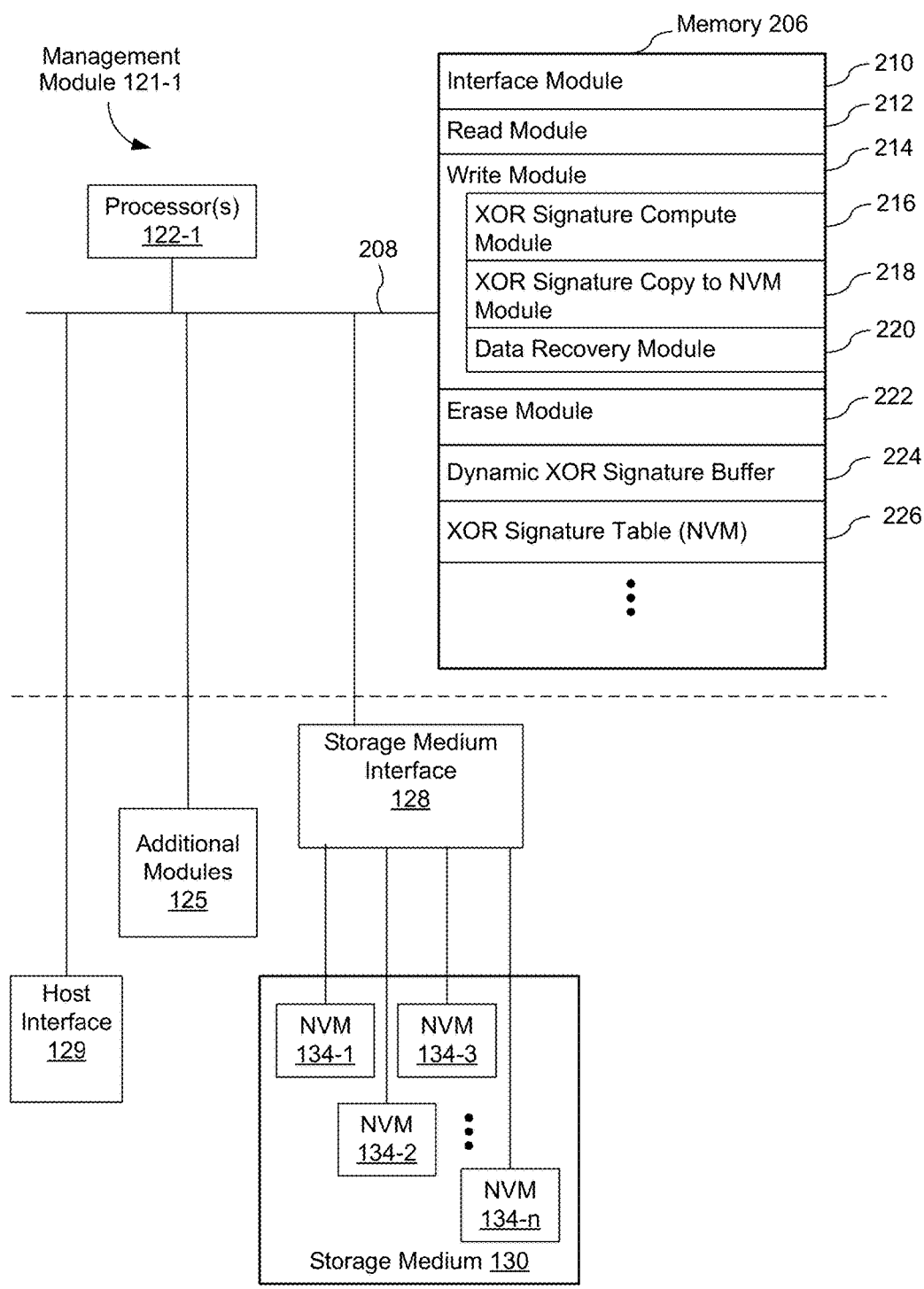
FIG. 2 is a block diagram illustrating a memory management module of a non-volatile memory controller, in accordance with some embodiments.
Figure 3A:
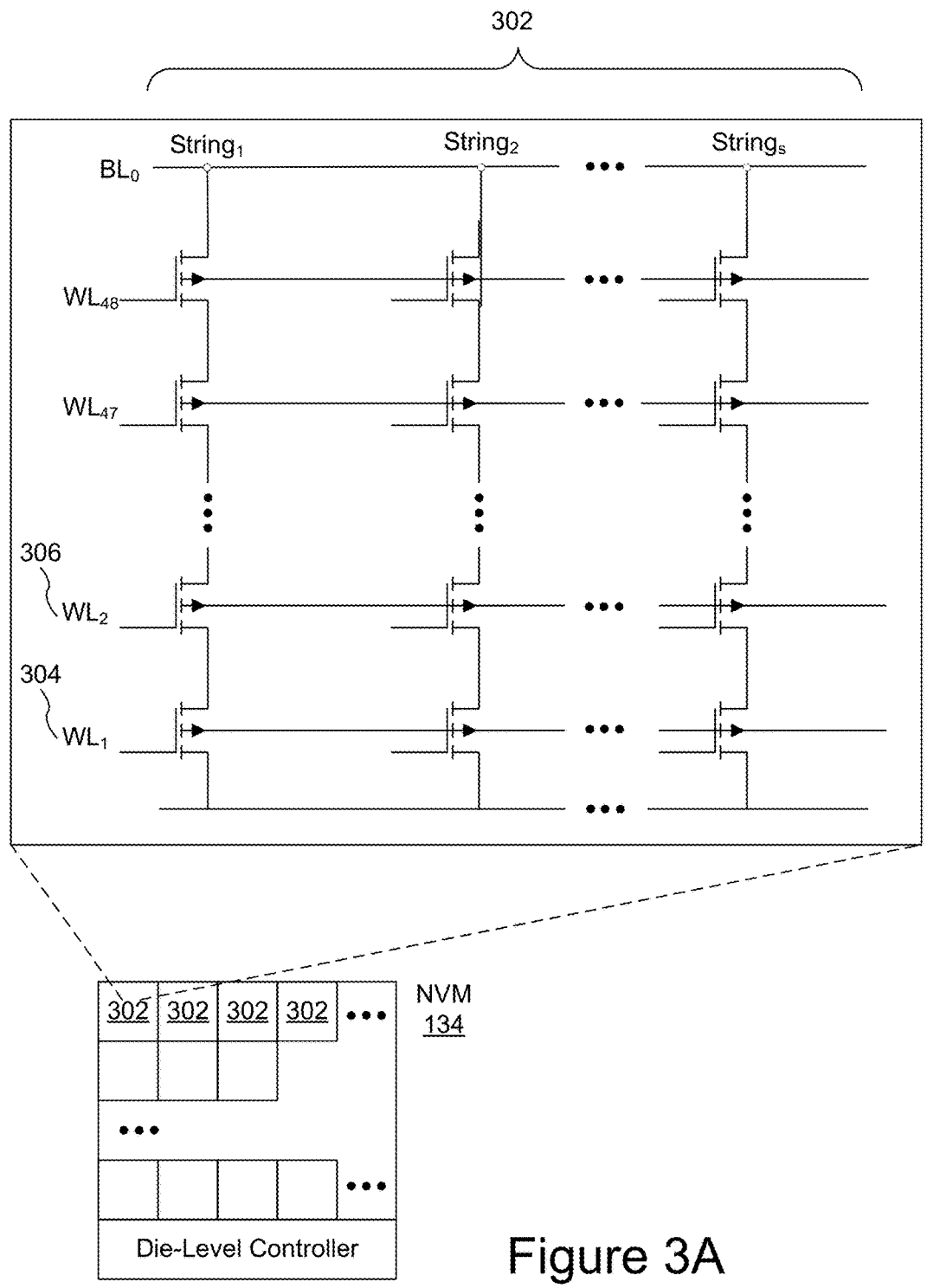
FIG. 3A is a diagram of multi-level flash memory cell (MLC) architecture for a semi-conductor memory device, in accordance with some embodiments.
Figure 3B:
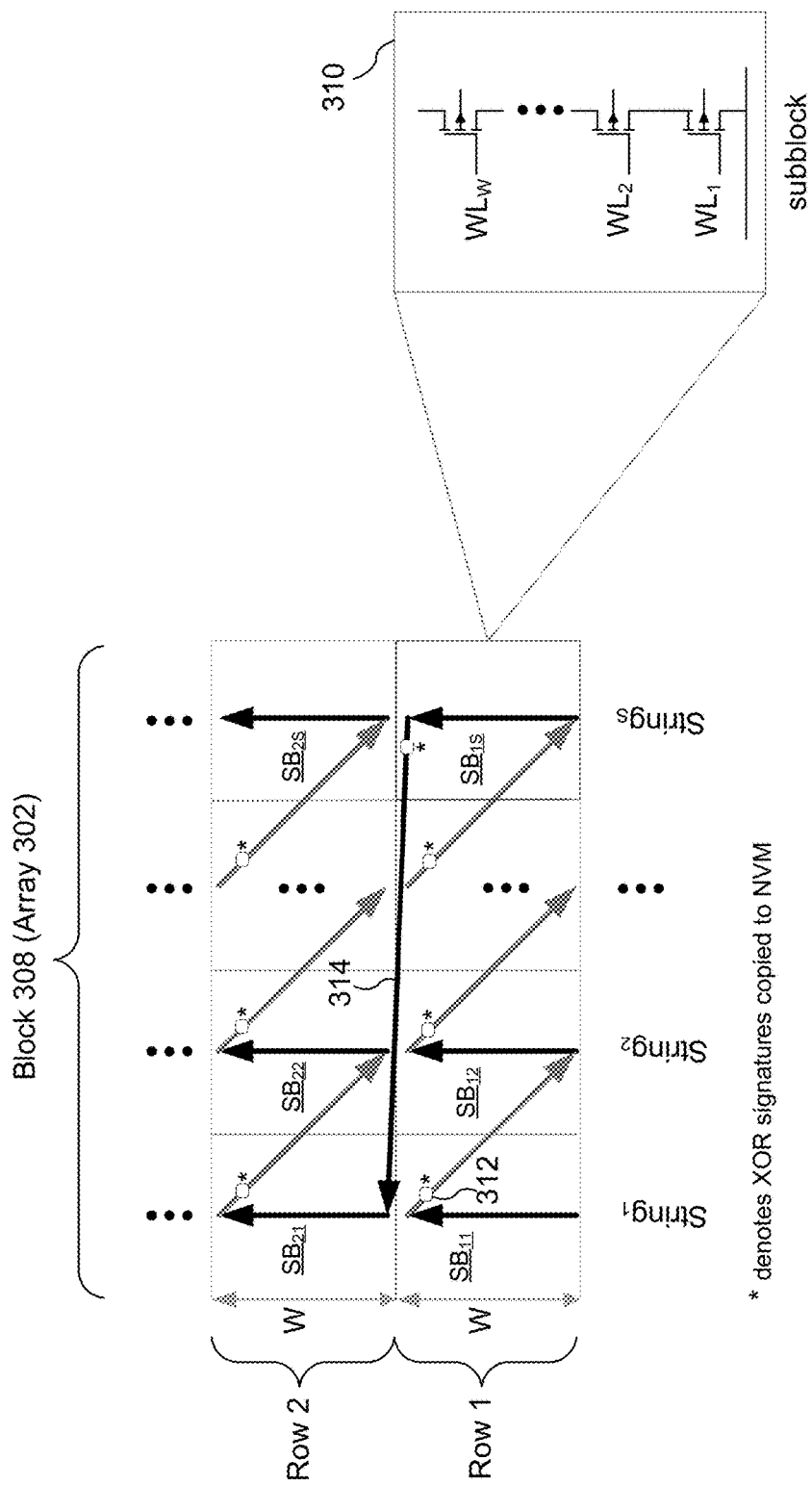
FIG. 3B is a diagram illustrating an order of operations when programming data in a block of a three dimensional non-volatile memory array, in accordance with some embodiments.
Figure 3C:
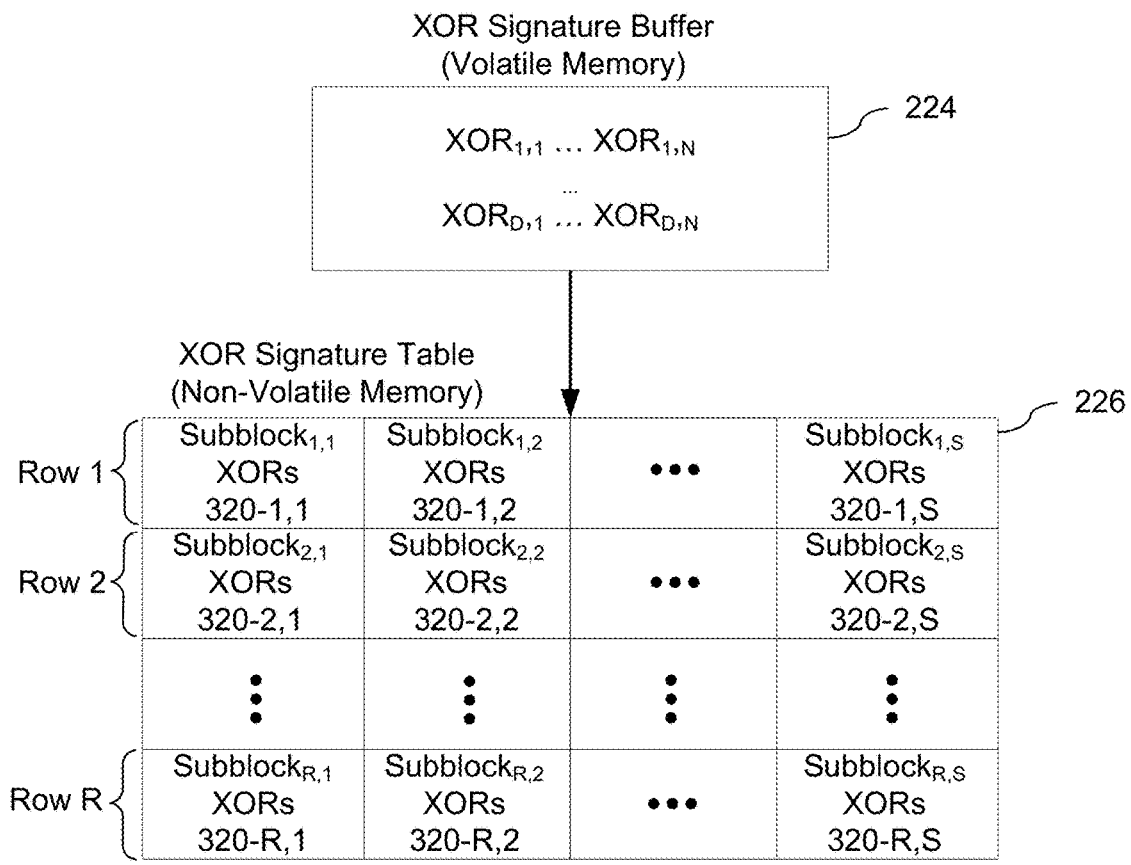
FIG. 3C illustrates an XOR signature buffer in volatile memory and an XOR table for storing XOR signatures in non-volatile memory, in accordance with some embodiments.

FIG. 2 is a block diagram illustrating an implementation of a management module 121-1, 121-2, (hereinafter management module 121 unless specifically designated otherwise), in accordance with some embodiments. Management module 121 typically includes one or more processing units 122-1 (sometimes herein called CPUs, processors, or hardware processors, and sometimes implemented using microprocessors, microcontrollers, or the like) for executing modules, programs and/or instructions stored in memory 206 and thereby performing processing operations, memory 206 (sometimes herein called controller memory), and one or more communication buses 208 for interconnecting these components. Communication buses 208 optionally include circuitry (sometimes called a chipset) that interconnects and controls communications between system components. In some embodiments, such as those represented by FIGS. 1 and 2, management module 121 is coupled to host interface 129, additional modules 125, and storage medium interface 128 by communication buses 208. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from processor(s) 122-1. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset or superset thereof:

- an interface module 210 used for communicating with other components, such as non-volatile memory devices 134 and computer system 110;
- a read module 212 used for reading from non-volatile memory devices 134;
- a write module 214 used for writing to non-volatile memory devices 134; the write module contains several sub-modules including XOR signature compute module 216, XOR signature copy to NVM module 218, and data recovery module 220, which are described in more detail below;
- an erase module 222 that is used for erasing portions (e.g., selectable portion 131) of storage medium 130;
- a dynamic XOR signature buffer 224 used for storing XOR signatures produced while programming data in (i.e., writing data to) a subblock of a memory block; dynamic XOR signature buffer 224 is typically located in volatile memory of management module 121; and
- an XOR signature table (NVM) 226 used for storing XOR signatures copied from the dynamic XOR signature buffer 224, and more generally storing XOR signatures produced while programming data in subblocks of a memory block, as explained in more detail below with reference to FIG. 3C; XOR signature table (NVM) 226 is typically located in non-volatile memory of management module 121.

Each of the above identified elements may be stored in one or more of the previously mentioned memory devices that together form memory 206, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing respective operations in the methods described below with reference to FIGS. 3A, 3B, 3C-3D, 4, 5A-5E, and 6A-6B.

Although FIG. 2 shows management module 121-1, FIG. 2 is intended more as a functional description of the various features that may be present in a management module, or non-volatile memory controller, than as a structural schematic of the embodiments described herein. In practice, and as recognized by those of ordinary skill in the art, items shown separately could be combined and some items could be separated. Further, as noted above, in some embodiments, one or more modules or sub-modules of management module 121-1 are implemented in management module 121-2 of computer system 110.

A single-level flash memory cell (SLC, also referred to as X1) stores one bit ("0" or "1"). Thus, the storage density of an SLC memory device is one bit of information per memory cell. A multi-level flash memory cell (MLC, also referred to as X2), however, can store two or more bits of information per cell by using different ranges within the total voltage range of the memory cell to represent a multi-bit bit-tuple. In turn, the storage density of an MLC memory device is multiple-bits per cell (e.g., two bits per memory cell). A triple-level memory cell (TLC, also referred to as X3) has eight possible states per cell, yielding three bits of information per cell. However, it is noted that sometimes the term "MLC" is used to refer to flash memory cells that store two or more bits per cell.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage, is used to represent one or more data values. In some embodiments, during a read operation, a reading threshold voltage is applied to the control gate of the transistor and the resulting sensed current or voltage is mapped to a data value.

The terms "cell voltage" and "memory cell voltage," in the context of flash memory cells, typically mean the threshold voltage of the memory cell, which is the minimum voltage that needs to be applied to the gate of the memory cell's transistor in order for the transistor to conduct current. Similarly, reading threshold voltages (sometimes also called reading signals, reading voltages, and/or read thresholds) applied to flash memory cells are gate voltages applied to the gates of the flash memory cells to determine whether the memory cells conduct current at that gate voltage. In some embodiments, when a flash memory cell's transistor conducts current at a given reading threshold voltage, indicating that the cell voltage is less than the reading threshold voltage, the raw data value for that read operation is a "1," and otherwise the raw data value is a "0."

FIG. 3A is a simplified diagram of a three dimensional non-volatile memory array 302, sometimes herein called a block or non-volatile memory block or 3D block, in accordance with some embodiments. Array 302 includes orthogonal word lines, strings, and bit lines. The number of word lines in array 302 varies from implementation to implementation, and is 48 in the example shown in FIG. 3A. Sequential set of word lines in array 302 form a contiguous set. For example, word lines 1 ($WL_1$) through 4 ($WL_4$, not shown) are a contiguous set of word lines in array 302. Array 302 includes S strings denoted $String_1$ to $String_S$, and further includes bit lines, one of which is shown in FIG. 3A, and others of which are above or below the page or plane of memory cells shown in FIG. 3A. Stated another way, array 302 includes multiple parallel planes of memory cells, one of which is shown in FIG. 3A, and the others of which are above and/or below the plane shown in FIG. 3A. Typically, all the memory cells (e.g., on B bit lines) corresponding to a specified word line and string (in a specified memory block), are accessed in parallel, thereby accessing one or more pages of data in a single memory access operation.

FIG. 3B is a diagram illustrating an order of operations when programming data (also called writing data) in a block 308 of a three dimensional non-volatile memory device (e.g., a 3D flash memory die), in accordance with some embodiments. Block 308, which corresponds to array 302 in FIG. 3A, includes word lines, strings, and bit lines, as discussed above with respect to FIG. 3A. Block 308 includes a plurality of rows of subblocks, each row having S subblocks, where S is the number of strings in the respective block. The S subblocks of the row have a predefined order (e.g., subblock 1, subblock 2, subblock 3 . . . subblock S) in which the subblocks are programmed with data. Each row of the plurality of rows includes a contiguous subset of the plurality of word lines in the block that is distinct from the contiguous subset of the plurality of word lines in every other row of the block. Furthermore, each subblock (in at least two of the rows) includes the portion of one string corresponding to a contiguous set of W word lines. It is noted that in some embodiments, a last row of block 308 may have fewer word lines than the other rows, in which case two or more of the rows each have a distinct contiguous set of W word lines, but in other embodiments, all the rows have distinct contiguous sets of W word lines.

For example, in FIG. 3B, subblock $SB_{11}$ includes the portion of string 1 that falls within row 1, whereas subblock $SB_{21}$ includes the portion of string 1 that falls within row 2. Row 1 includes a row of subblocks, $SB_{11}$ to $SB_{1S}$. Each row includes W word lines (e.g., $WL_1$ to $WL_W$), as shown in a scaled view of subblock $SB_{1S}$ 310.

Within each subblock, data is programmed (i.e., written) into the pages of a contiguous sequence of word lines along a single string. In some embodiments, the number of pages, N, per word line is typically 1 (for X1 memory cells), 2 (for X2 memory cells) or 3 (for X3 memory cells), but could include more than 3 in future implementations. Thus, the number of pages of data programmed in a subblock is W*N pages, where "W" represents the number of word lines in the subblock and "N" represents the number of pages per word line. The programming continues sequentially through the word lines of the subblock, as represented by the upward pointed arrow in each subblock shown in FIG. 3B, prior to programming data into a next subblock.

After programming data in a first subblock of a row, the programming process continues at the next subblock within the row. For example, after subblock 11 ($SB_{11}$) has been programmed with data, the programming process continues at the next subblock 12 ($SB_{12}$). If the subblock being programmed is the final subblock in a row, for example $SB_{1S}$, the subsequent subblock to be programmed is the first subblock of the subsequent row of subblocks (e.g., after the subblocks of row 1 have been programmed, the process continues with the subblocks of row 2). Shown in FIG. 3B, after subblock $SB_{1S}$ is fully programmed, the subsequent subblock to be programmed is $SB_{21}$.

FIG. 3C illustrates XOR signature buffer 224 in volatile memory and XOR signature table 226 in non-volatile memory, in accordance with some embodiments. The buffer has sufficient capacity to store N*D XOR signatures, which typically takes the same amount of storage space as N*D pages of data. For example, if the pages each store 8K bytes, N is equal to 3 and D is equal to 3, the amount of volatile memory occupied by XOR signature buffer 224 is 72K bytes. The buffer stores the XOR signatures for a single subblock as those XOR signatures are generated, while data is written to the subblock. Once the subblock has been fully programmed, the XOR signatures for that subblock are copied from XOR signature buffer 224 to an assigned portion of XOR signature table 226 in non-volatile memory. More specifically, XOR signature table 226 in non-volatile memory includes an entry 320 for each subblock of a respective block 308 (see FIGS. 3A, 3B) of the storage device, and the XOR signatures for that subblock are copied to that entry 320 when programming of that subblock is complete.

In some embodiments, once all the subblocks of a block 308 (or array 302) have been programmed and the block is closed (i.e., indicating that no more data will be written to the block, at least until the entire block is erased and re-opened), the XOR signatures in XOR signature table 226 can be erased, or marked invalid and available for erasure, as they are no longer needed.

In the example shown in FIG. 3C, the block has R rows of subblocks, and S subblocks per row, and thus has capacity to stored R*S*D*N XOR signatures, which is R*S times the number of XOR signatures for a single subblock (and R*S times the storage capacity required for XOR signature buffer 224).

The generation of the XOR signatures for a subblock is discussed below with reference to operation 402 of FIG. 4, and the use of the XOR signatures to recover data after a word line short circuit occurs during the writing of data to the block is discussed below with reference to operation 414 of FIG. 4.

Figure 4:
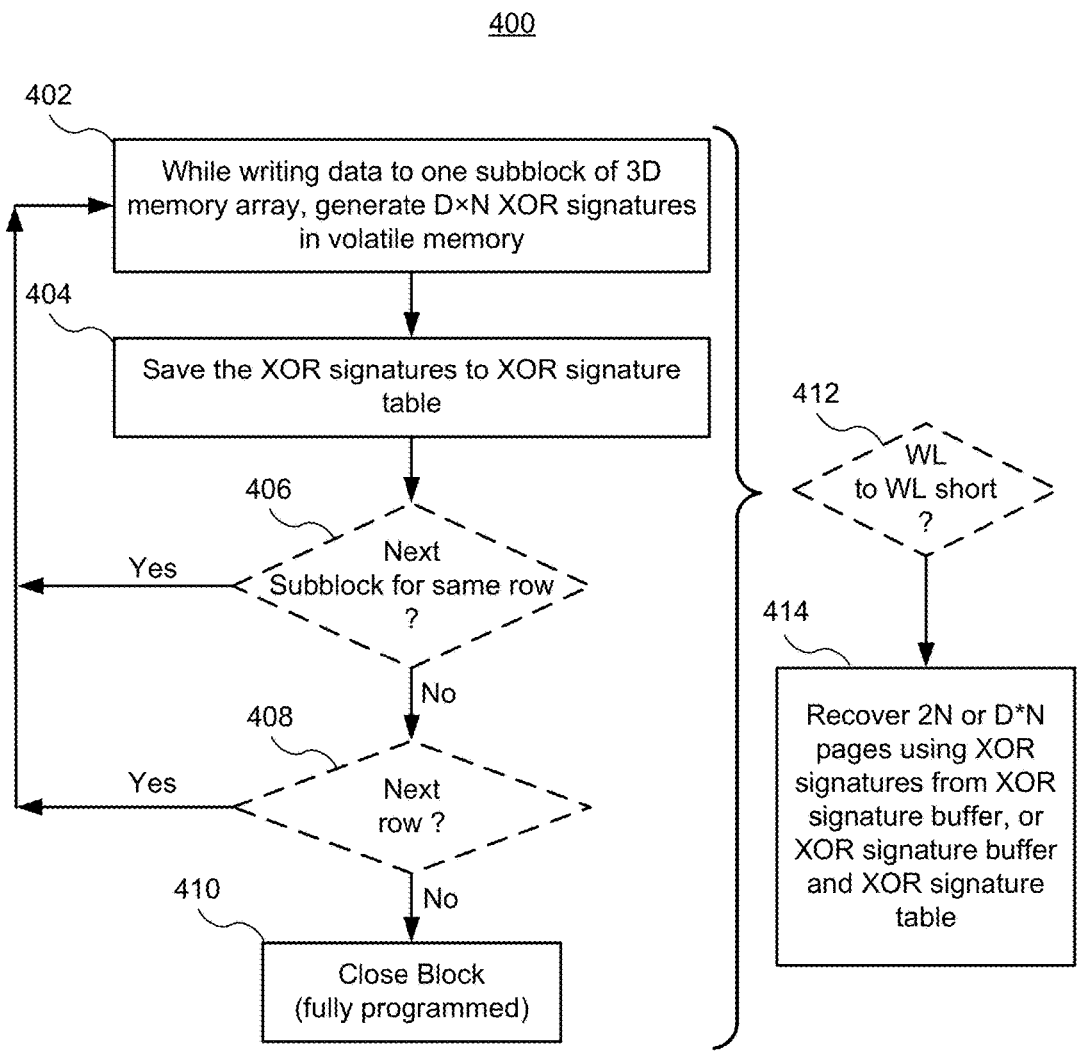
FIG. 4 illustrates a conceptual flowchart representation of a method of programming data in a block of a three dimensional non-volatile memory array, and recovering data after a word line to word line short circuit, in accordance with some embodiments.
Figure 5B:
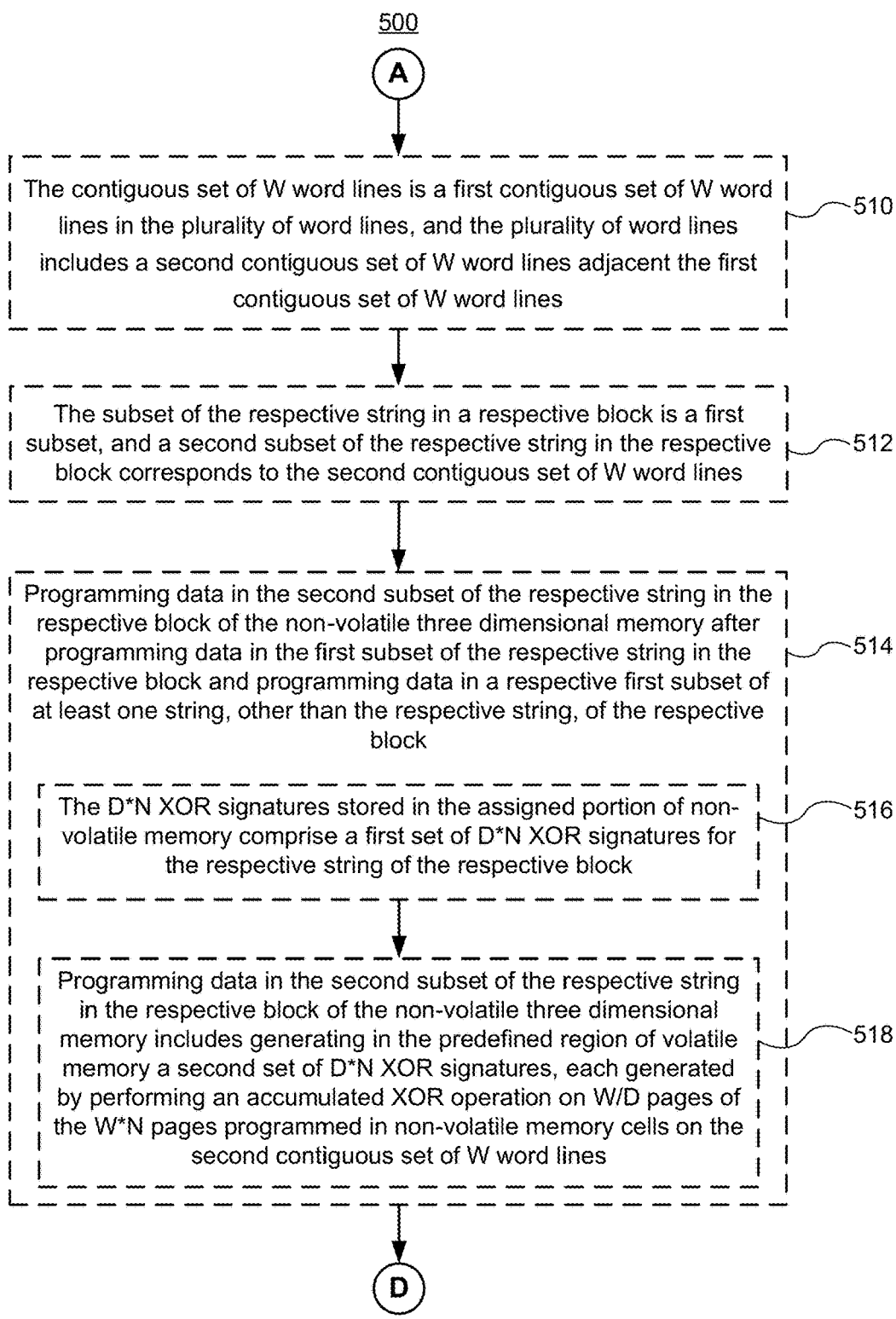
Figure 5C:
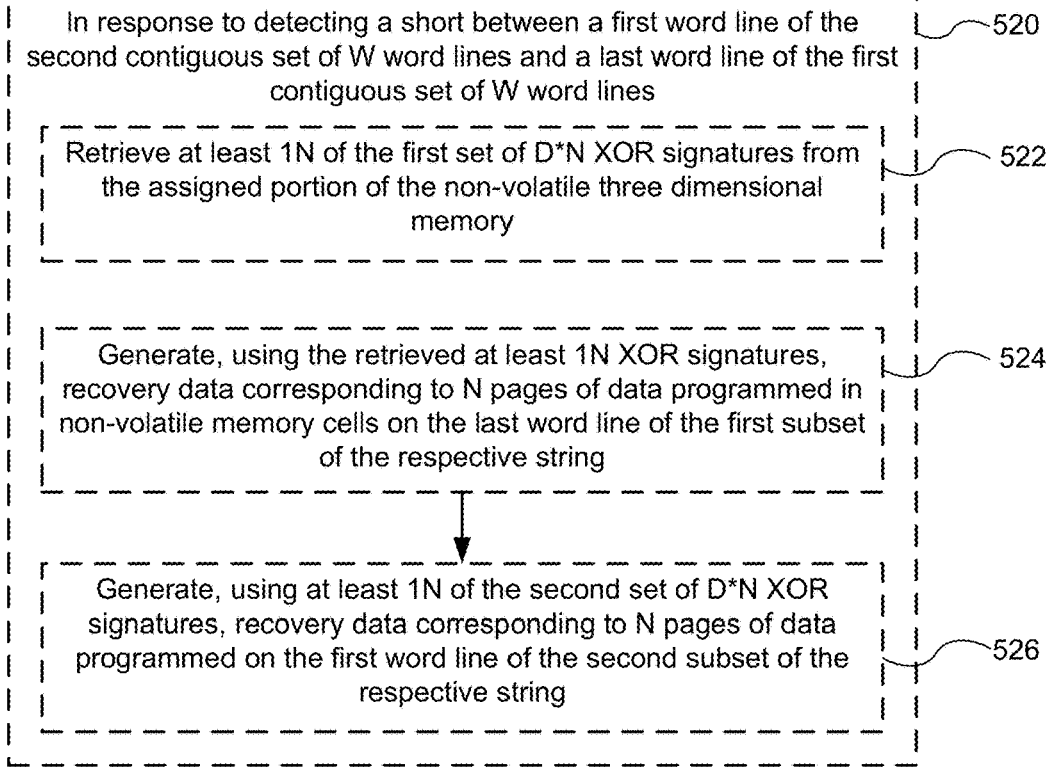
Figure 5D:
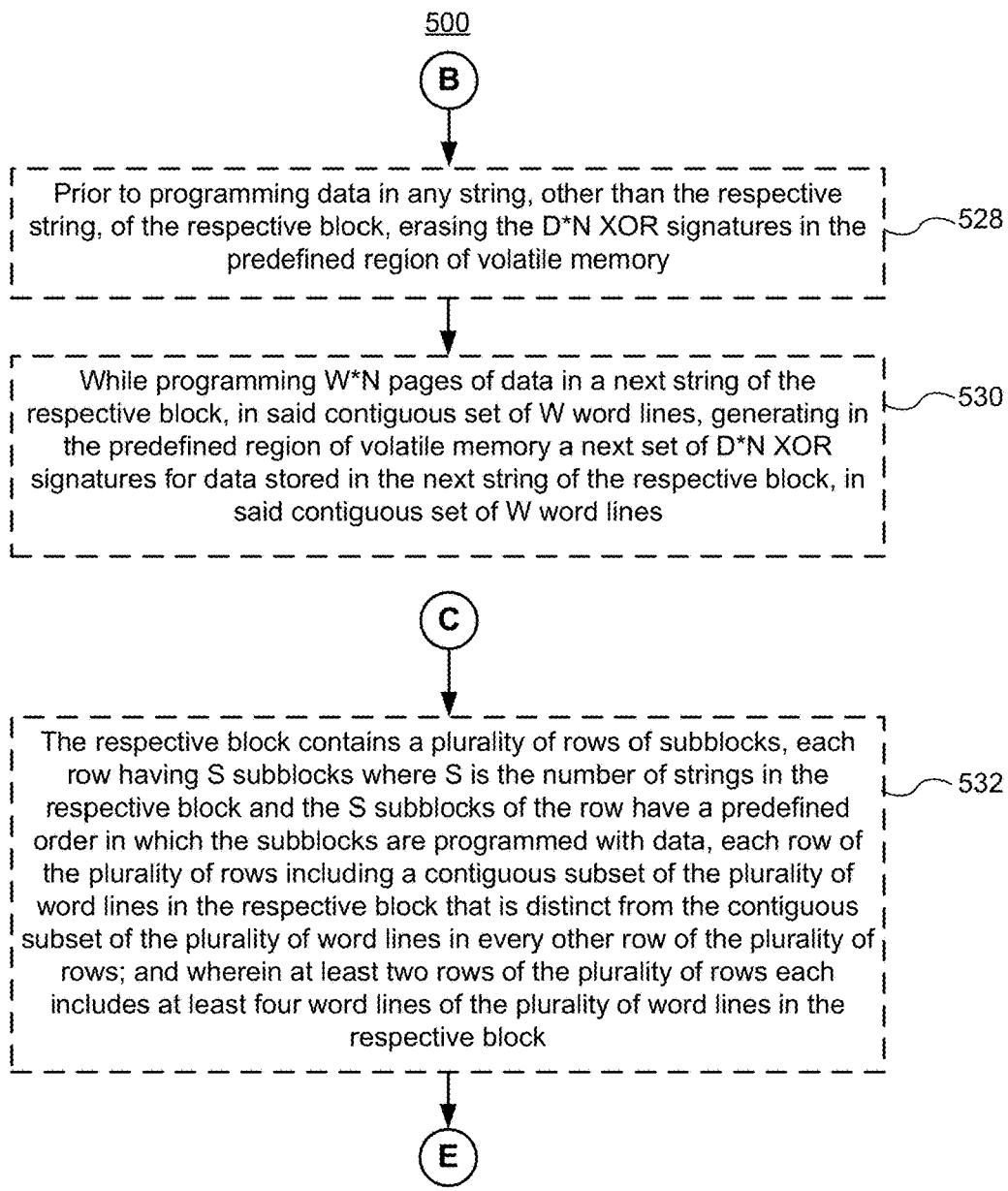
Figure 5E:
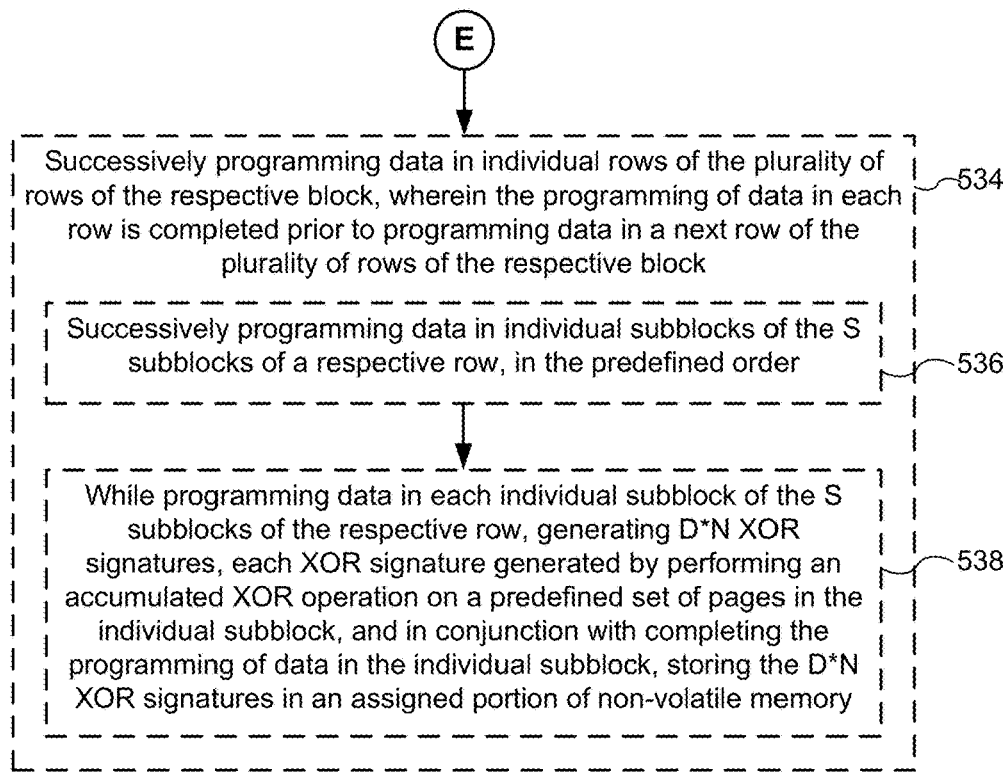

FIG. 4 illustrates a conceptual flowchart representation of a method 400 of programming data in a block of a three dimensional non-volatile memory array, and recovering data in response to a word line to word line short circuit, in accordance with some embodiments. With reference to the data storage system 100 illustrated in FIG. 1, in some embodiments, method 400 is performed by a storage device (e.g., storage device 120) or one or more components of the storage device (e.g., storage controller 124). In some embodiments, method 400 is governed by instructions that are stored in a non-transitory computer-readable storage medium and that are executed by one or more processors of a device, such as the one or more processing units (CPUs) 122-1 of management module 121-1 (FIG. 2).

For ease of explanation, method 400 is described below as performed by a storage device (e.g., storage device 120, FIG. 1). With reference to FIG. 2, in some embodiments, the operations of method 400 are performed, at least in part, by a write module (e.g., write module 214, FIG. 2), an XOR signature compute module (e.g., XOR signature compute module 216, FIG. 2), an XOR signature copy to NVM module (e.g., XOR signature copy to NVM module 218, FIG. 2) and/or a data recovery module (e.g., data recovery module 220, FIG. 2) of management module 121-1.

Method 400 includes, while writing data to a subblock of a block of a three-dimensional non-volatile memory array, generating (402) D*N XOR signatures in volatile memory. If the maximum number of contiguous shorted word lines for which data can be recovered is two, then N XOR signatures are generated for the even word lines of the subblock and another N XOR signatures are generated for the odd word lines of the subblock. Similarly, if the maximum number of contiguous shorted word lines for which data can be recovered is three, then N XOR signatures are generated for a first set of every third word lines of the subblock, another N XOR signatures are generated for a second set of word lines of the subblock offset by one from the first set, and yet another N XOR signatures are generated for a third set of word lines of the subblock offset by two from the first set.

For ease of explanation, the operation of method 400 is explained with reference to an example of a 3D memory device having blocks with four strings (i.e., S=4), and thus four subblocks per row (see FIG. 3B) of the block. Furthermore, in this example, each subblock has six word lines (i.e., W=6), where three pages of data are stored on each word line of the subblock (i.e., N=3). Furthermore, for purposes of this explanation, it will be assumed that D, the maximum number of word lines that can be short circuited while writing data to the block, is equal to two (i.e., D=2).

When a first set of N pages of data are written to a first word line of the subblock, a first set of N XOR signatures in XOR signature buffer 224 are overwritten with the data from the first set of N pages. Alternatively, each page of data in the first set of N pages is XOR'd with the corresponding XOR signature in XOR signature buffer 224 (i.e., the page of data is combined with the corresponding XOR signature using an exclusive OR operation), and the resulting XOR signatures are stored in XOR signature buffer 224. Similarly, when a second set N pages of data are written to a second word line of the subblock, a second set of N XOR signatures in XOR signature buffer 224 are overwritten with the data from the second set of N pages. Alternatively, each page of data in the second set of N pages is XOR'd with the corresponding XOR signature in XOR signature buffer 224 (i.e., the page of data is combined with the corresponding XOR signature using an exclusive OR operation), and the resulting XOR signatures are stored in XOR signature buffer 224.

When a third set of N pages of data are written to a third word line of the subblock, the third set N pages are each XOR'd with a corresponding one of the N XOR signatures in XOR signature buffer 224, and the resulting values replace the first set of N XOR signatures in XOR signature buffer 224. Since the corresponding XOR signatures in the XOR signature buffer were initialized with data from the first set of N pages, the N XOR signatures resulting from this operation each correspond to the values generated by XORing a page from the first set of N pages of data with a page from the third set of N pages of data.

When a fourth set of N pages of data are written to a fourth word line of the subblock, the fourth set N pages are each XOR'd with a corresponding one of the N XOR signatures in XOR signature buffer 224, and the resulting values replace the second set of N XOR signatures in XOR signature buffer 224. Since the corresponding XOR signatures in the XOR signature buffer were initialized with data from the second set of N pages, the N XOR signatures resulting from this operation each correspond to the values generated by XORing a page from the second set of N pages of data with a page from the fourth set of N pages of data.

This processing of writing data and updating the first and second sets of N XOR signatures in XOR signature buffer 224 is repeated when fifth and sixth sets of N pages of data are written to the fifth and sixth word lines of the subblock, respectively. If the subblock were to have more than six word lines, the processing of writing data and updating the first and second sets of N XOR signatures in XOR signature buffer 224 would be repeated until data has been written to all word lines of the subblock.

Upon completion of the writing of data to the subblock (402), the D*N XOR signatures in XOR signature buffer 224, which is in volatile memory, are saved (404) to (i.e., copied to) XOR signature table 226, which is stored in non-volatile memory. Furthermore, the D*N XOR signatures in XOR signature buffer 224 are erased, or reset to a predefined initial value, such as all zeros, to prepare for generating a next set of D*N XOR signatures for a next subblock. In some embodiments, the erasure of the XOR signatures in the XOR signature buffer occurs prior to writing data to a next subblock of the block, to prepare for generating a new set of XOR signatures for that next subblock.

Operations 402 and 404 are repeated (406—Yes) for each subblock of the current row of the block, thereby writing data to an entire row of subblocks of the block, and generating a distinct set of D*N XOR signatures for each subblock, which are stored in the XOR signature table at the conclusion of writing data to each subblock.

When data has been written to all the subblocks of a row (406—No), data is written to a next row, if any, of the block. Thus, operations 402, 404 and 406 are repeated (408—Yes) for each row of the block, thereby writing data to all the rows of the block, and generating S distinct sets of D*N XOR signatures for the S subblocks of each row, which are stored in the XOR signature table. When data has been written to all the rows of a block (408—No), the block is closed (e.g., by putting the block on a list of closed blocks, or storing metadata indicating the block is closed). Furthermore, once the block is closed, the XOR signatures in the XOR signature table are no longer needed, and the signatures in the XOR signature table for the closed block can be erased.

During the process of writing data to the block, a word line to word line short circuit may occur (412), which triggers a data recovery process (414). A word line to word line short circuit causes the memory cells on the affected word lines to be inaccessible, effecting erasing or making unavailable all data previously written to the pages on those word lines. Data recovery process 414 uses the XOR signatures in XOR signature buffer 224 to recover data written to short circuited word lines of the current subblock to which data is being written, while the XOR signatures in XOR signature table 226 are used to recover data written to short circuited word lines, if any, of subblocks to which data was previously written.

For example, in the context of FIG. 3B, if two word lines short circuit in subblock $SB_{22}$ while data is being written to subblock $SB_{22}$, XOR signatures in XOR signature table 226 are used to recover data written the short circuited word lines of subblock $SB_{22}$. Furthermore, that same short circuit will have destroyed or made unreadable data stored on the same word lines in subblock $SB_{12}$. Recovery of data written to the short circuited word lines of subblock $SB_{12}$ is accomplished using XOR signatures for subblock $SB_{12}$ that were stored in XOR signature table 226 when the writing of data to subblock $SB_{12}$ was completed.

In general, the data for any page stored (i.e., previously stored) in any of the shorted word lines is recovered by exclusive ORing (XORing) the XOR signature for that page with all the other pages of data, if any, that were used to generate the XOR signature. Furthermore, the XOR signature for the page of data to be recovered will be stored in XOR signature buffer 224 if the page is located in the subblock to which data was being written when the word line short occurred, and otherwise will be stored in XOR signature table 226. If there are N pages of data stored on each word line, there are N corresponding XOR signatures for those N pages, initially stored in XOR signature buffer 224 while the N XOR are generated, and then moved to XOR signature table 226 after data has been to all the word lines of the subblock.

For example, if a word line to word line short occurs while writing data to word line 4 of a respective subblock, such as subblock $SB_{22}$, causing a short between word line 3 and word line 4, data will need to be recovered for the pages of data written to word lines 3 and 4 of the respective subblock. Assuming three pages are stored per word line, six pages of data are made inaccessible by the word line short. The data recovery is accomplished by accessing six XOR signatures from XOR signature buffer 224, and then XORing each of those XOR signatures with data read from a corresponding page on word lines 1 or 2, depending which page is being recovered. The three pages on word line 4 are recovered by XORing the three XOR signatures corresponding to word line 4 with corresponding ones of the three pages stored on word line 2 of the subblock. Similarly, the three pages on word line 3 are recovered by XORing the three XOR signatures corresponding to word line 3 with corresponding ones of the three pages stored on word line 1 of the subblock.

In another example, in the case of a short circuit between the first word line of subblock $SB_{22}$ (in Row 2) and the last word line of subblock $SB_{12}$ (in Row 1), which occurs while writing data to the first word line of subblock $SB_{22}$, data recovery will be needed for the last word line of all the subblocks in Row 1 of the memory block 308, and will also be needed for the first word line of the first two subblocks in Row 2. In this example, data recovery is accomplished using XOR signatures for the subblocks in Row 1 and XOR signatures for the first subblock in Row 2, obtained from XOR signature table 226, while data recovery for the short circuited word line in subblock $SB_{22}$ is accomplished using the XOR signatures in XOR signature buffer 224. It is further noted that in this example, the XOR signatures in XOR signature buffer 224 will typically contain the data to be recovered, and need not be XORed with another other data, because those XOR signatures were generated solely from data written to the first word line of subblock $SB_{22}$.

FIGS. 5A-5E illustrate a flowchart representation of a method 500 of programming data in a respective block of a three dimensional non-volatile memory array, in accordance with some embodiments. With reference to the data storage system 100 illustrated in FIG. 1, in some embodiments, method 500 is performed by a storage device (e.g., storage device 120) or one or more components of the storage device (e.g., storage controller 124). In some embodiments, method 500 is governed by instructions that are stored in a non-transitory computer-readable storage medium and that are executed by one or more processors of a device, such as the one or more processing units (CPUs) 122-1 of management module 121-1 (FIG. 2).

For ease of explanation, method 500 is described below as performed by a storage device (e.g., storage device 120) having non-volatile memory, including a non-volatile three dimensional memory having a plurality of blocks, each block including a plurality of strings, a plurality of word lines and a plurality of bit lines. With reference to FIG. 2, in some embodiments, the operations of method 500 are performed, at least in part, by a write module (e.g., write module 214, FIG. 2), an XOR signature compute module (e.g., XOR signature compute module 216, FIG. 2), an XOR signature copy to NVM module (e.g., XOR signature copy to NVM module 218, FIG. 2) and/or a data recovery module (e.g., data recovery module 220, FIG. 2) of management module 121-1.

Method 500 is a method of programming data in a subset of a respective string (e.g., in a subblock, as shown in FIG. 3B) in a respective block of the non-volatile three dimensional memory. Method 500 is accomplished by performing a set of operations that includes programming (502) a plurality of pages of data in non-volatile memory cells on each word line, in the respective string, in a contiguous set of W word lines in the plurality of word lines of the respective block. This includes programming N pages of data in the non-volatile memory cells on each word line in the contiguous set of W word lines, where N is a positive integer greater than 1, W is the number of word lines in the contiguous set of word lines, and W has a value greater than 3. Programming data in the W word lines of a single subblock of a 3D non-volatile memory block is described above with reference to FIGS. 3A, 3B and 4 (402).

In conjunction with programming W*N pages of data in non-volatile memory cells on the contiguous set of W word lines (e.g., in a subblock), method 500 includes generating in a predefined region of volatile memory (e.g., XOR signature buffer 224) D*N XOR signatures, each generated by performing an accumulated XOR operation on W/D pages of the W*N pages programmed in the non-volatile memory cells on the contiguous set of W word lines, wherein D is a positive integer greater than 1. The generation of XOR signatures for a respective subblock is described above with reference to operation 402 of method 400. It is noted that D is the maximum number of shorted word lines for which data can be recovered using the XOR signatures generated using method 500. D is typically equal to 2 or 3.

Prior (504) to programming data in any string, other than the respective string, of the respective block (i.e., prior to programming data in a next subblock), method 500 includes, in response to detecting a short between M word lines in the contiguous set of W word lines, where M is a positive integer no greater than D (e.g., in response to detecting a short between two word lines, where M=2 and D=3), generating (506), using M*N XOR signatures (e.g., 6 XOR signatures, where M=2 and N=3) of the D*N XOR signatures, recovery data corresponding to M*N pages of data programmed on the M word lines. Data recovery using XOR signatures is discussed above with reference to operation 414 of method 400.

In addition, method 500 includes, prior (504) to programming data in any string, other than the respective string, of the respective block (i.e., prior to programming data in a next subblock), storing (508) the D*N XOR signatures in an assigned portion of non-volatile memory (e.g., XOR signature table 226) that is distinct from the respective block of the non-volatile three dimensional memory.

In some embodiments, the contiguous set of W word lines is (510) a first contiguous set of W word lines in the plurality of word lines, and the plurality of word lines includes a second contiguous set of W word lines adjacent the first contiguous set of W word lines. The subset of the respective string in a respective block is a first subset, and a second subset of the respective string in the respective block corresponds to the second contiguous set of W word lines (512). For example, as shown in FIG. 3B, the first contiguous set of W word lines is in a subblock (e.g., subblock $SB_{12}$) in Row 1 of a block 302, and the second contiguous set of W word lines is in a subblock (e.g., subblock $SB_{22}$) in Row 2 of the block 302.

In these embodiments (corresponding to 510 and 512), method 500 further includes programming data (514) in the second subset of the respective string in the respective block of the non-volatile three dimensional memory after programming data in the first subset of the respective string in the respective block (e.g., programming data in a subblock, such as subblock $SB_{12}$ in Row 1) and programming data in a respective first subset of at least one string, other than the respective string, of the respective block (e.g., in another subblock, such as subblock $SB_{13}$ in Row 1).

In some embodiments, the D*N XOR signatures stored in the assigned portion of non-volatile memory are (516) a first set of D*N XOR signatures for the respective string of the respective block. As explained above, a set of D*N XOR signatures are generated and stored for each successive subblock as data is programmed into each successive subblock. Furthermore, in some of these embodiments, programming data in the second subset of the respective string in the respective block of the non-volatile three dimensional memory includes generating (518) in the predefined region of volatile memory a second set of D*N XOR signatures, each generated by performing an accumulated XOR operation on W/D pages of the W*N pages programmed in non-volatile memory cells on the second contiguous set of W word lines.

Furthermore, in these embodiments, method 500 further includes, in response to detecting (520 a short between a first word line of the second contiguous set of W word lines and a last word line of the first contiguous set of W word lines (e.g., in the context of FIG. 3B, a short between a first word line in Row 2 of the block and a last word line of Row 1 of the block), retrieving (522) at least 1N of the first set of D*N XOR signatures from the assigned portion of non-volatile memory, and generating (524), using the retrieved at least 1N XOR signatures, recovery data corresponding to N pages of data programmed in non-volatile memory cells on the last word line of the first subset of the respective string. In addition, in response to detecting (520) the aforementioned short, method 500 includes generating (526), using at least 1N of the second set of D*N XOR signatures, recovery data corresponding to N pages of data programmed on the first word line of the second subset of the respective string.

Thus, for example, N pages of data that were stored on the last word line of a subblock in Row 1 are recovered by retrieving N XOR signatures for that subblock from XOR signature table 226, and generating recovery data using those N XOR signatures. Continuing the example, in addition, N pages of data that were stored on the first word line of a subblock in Row 2 are recovered by retrieving N XOR signatures for that subblock from XOR signature buffer 224. As explained above with reference to operation 414 of method 400, recovery data is generated by XORing each of the aforementioned XOR signatures with all the other pages of data used to generate that XOR signature in order to recover the data on the shorted word line.

In some embodiments, method 500 includes, prior to programming data in any string, other than the respective string, of the respective block, erasing (528) the D*N XOR signatures in the predefined region of volatile memory, and while programming W*N pages of data in a next string of the respective block, in said contiguous set of W word lines, generating (530) in the predefined region of volatile memory a next set of D*N XOR signatures for data stored in the next string of the respective block, in said contiguous set of W word lines. Thus, referring to FIGS. 2, 3B and 3C, prior to programming data in a next subblock, the XOR signatures in XOR signature buffer 224 are erased (e.g., copied to XOR signature table 226 and then erased), and a next set of XOR signatures are generated while programming data into a next subblock (e.g., a next subblock in the same row of subblocks as the prior subblock). Furthermore, erasing the XOR signatures in volatile memory is typically accomplished by resetting the D*N XOR signatures in the predefined region of volatile memory to a predefined initial state, to prepare for generating a next set of D*N XOR signatures, for example for a next string in the block or in a next block.

In some embodiments (e.g., as shown in FIG. 3B), the respective block contains (532) a plurality of rows of subblocks, each row having S subblocks where S is the number of strings in the respective block and the S subblocks of the row have a predefined order in which the subblocks are programmed with data, each row of the plurality of rows including a contiguous subset of the plurality of word lines in the respective block that is distinct from the contiguous subset of the plurality of word lines in every other row of the plurality of rows. Furthermore, at least two rows of the plurality of rows each includes at least four word lines of the plurality of word lines in the respective block.

In such embodiments, method 500 further includes successively programming (534) data in individual rows of the plurality of rows of the respective block, wherein the programming of data in each row is completed prior to programming data in a next row of the plurality of rows of the respective block. Furthermore, programming data in a respective row of the respective block is accomplished by successively programming (536) data in individual subblocks of the S subblocks of a respective row, in the predefined order. Further, method 500 includes, while programming data in each individual subblock of the S subblocks of the respective row, generating (538) D*N XOR signatures, each XOR signature generated by performing an accumulated XOR operation on a predefined set of pages in the individual subblock, and in conjunction with completing the programming of data in the individual subblock, storing the D*N XOR signatures in an assigned portion of non-volatile memory (e.g., by copying the XOR signatures for the subblock from XOR signature buffer 224 to a portion of XOR signature table 226 corresponding to that subblock).

FIGS. 6A-6B illustrate a flowchart representation of a method 600 of programming data in a respective block of a three dimensional non-volatile memory array, in accordance with some embodiments. With reference to the data storage system 100 illustrated in FIG. 1, in some embodiments, method 600 is performed by a storage device (e.g., storage device 120) or one or more components of the storage device (e.g., storage controller 124). In some embodiments, method 600 is governed by instructions that are stored in a non-transitory computer-readable storage medium and that are executed by one or more processors of a device, such as the one or more processing units (CPUs) 122-1 of management module 121-1 (FIG. 2).

For ease of explanation, method 600 is described below as performed by a storage device (e.g., storage device 120) having non-volatile memory, including a non-volatile three dimensional memory having a plurality of blocks, each block including a plurality of strings, a plurality of word lines and a plurality of bit lines. With reference to FIG. 2, in some embodiments, the operations of method 600 are performed, at least in part, by a write module (e.g., write module 214, FIG. 2), an XOR signature compute module (e.g., XOR signature compute module 216, FIG. 2), an XOR signature copy to NVM module (e.g., XOR signature copy to NVM module 218, FIG. 2) and/or a data recovery module (e.g., data recovery module 220, FIG. 2) of management module 121-1.

Method 600 is a method of programming data in a respective block of the plurality of blocks of the non-volatile three dimensional memory;

Method 600 is a method of programming (602) data in a respective block (e.g., block 308, FIG. 3B) of non-volatile three dimensional memory. The respective block contains a plurality of rows of subblocks, each row having S subblocks where S is the number of strings in the respective block and the S subblocks of the row have a predefined order in which the subblocks are programmed with data, each row of the plurality of rows including a contiguous subset of the plurality of word lines in the respective block that is distinct from the contiguous subset of the plurality of word lines in every other row of the plurality of rows. At least two rows of the plurality of rows each includes a contiguous set of at least four word lines of the plurality of word lines in the respective block.

Programming (602) data in the respective block includes successively programming (604) data in individual rows of the plurality of rows of the respective block, wherein the programming of data in each row is completed prior to programming data in a next row of the plurality of rows of the respective block. Furthermore, programming (604) data in a respective row of the respective block includes successively programming (606) data in individual subblocks of the S subblocks of the respective row, in the predefined order (e.g., from left to right, or from subblock 1 to subblock S). The programming of data in each subblock of the S subblocks is completed prior to programming data in a next subblock of the S subblocks of the respective row.

Method 600 further includes, while programming data in each individual subblock of the S subblocks of the respective row, generating (608) D*N XOR signatures for the individual subblock, where N is a positive integer greater than 1. As described above with reference to operation 402 of method 400, each XOR signature is generated by performing an accumulated XOR operation on a predefined set of pages in the individual subblock, and in conjunction with completing the programming of data in the individual subblock, storing the D*N XOR signatures in an assigned portion of non-volatile memory (e.g., in XOR signature table 226).

In some embodiments, method 600 further includes, while programming data in a respective subblock, programming (610) N pages of data on each word line of the respective subblock, and in response to detecting a short between M word lines in the respective subblock, where M is a positive integer no greater than D, generating, using M*N XOR signatures of the D*N XOR signatures generated for the respective subblock, recovery data corresponding to M*N pages of data programmed on the M word lines. Data recovery using XOR signatures is discussed above with reference to operation 414 of method 400.

In some embodiments, method 600 further includes, while programming data in a respective subblock, programming (612) N pages of data on each word line of the respective subblock, and in response to detecting a short between two word lines in the respective subblock, generating, using 2N of the XOR signatures generated for the respective subblock, recovery data corresponding to 2N pages of data programmed on the two word lines. Data recovery using XOR signatures is discussed above with reference to operation 414 of method 400.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method of data recovery in a storage device having non-volatile memory, including a non-volatile three dimensional memory having a plurality of blocks, each block including a plurality of strings, a plurality of word lines and a plurality of bit lines, comprising:
    programming data in a subset of a respective string in a respective block of the non-volatile three dimensional memory by performing a set of operations comprising:
        programming a plurality of pages of data in non-volatile memory cells on each word line, in the respective string, in a contiguous set of W word lines in the plurality of word lines of the respective block, including programming N pages of data in the non-volatile memory cells on each word line in the contiguous set of W word lines, where N is a positive integer greater than 1, W is a number of word lines in the contiguous set of W word lines, and W has a value greater than 3;
        in conjunction with programming W*N pages of data in non-volatile memory cells on the contiguous set of W word lines, generating in a predefined region of volatile memory D*N XOR signatures, each generated by performing an accumulated XOR operation on W/D pages of the W*N pages programmed in the non-volatile memory cells on the contiguous set of W word lines, wherein D is a positive integer greater than 1; and
        prior to programming data in any string, other than the respective string, of the respective block,
        in response to detecting a short between M word lines in the contiguous set of W word lines, where M is a positive integer no greater than D, generating, using M*N XOR signatures of the D*N XOR signatures, recovery data corresponding to M*N pages of data programmed on the M word lines; and
        storing the D*N XOR signatures in an assigned portion of non-volatile memory that is distinct from the respective block of the non-volatile three dimensional memory.

2. The method of claim 1, further comprising,
prior to programming data in any string, other than the respective string, of the respective block, erasing the D*N XOR signatures in the predefined region of volatile memory; and
while programming W*N pages of data in a next string of the respective block, in said contiguous set of W word lines, generating in the predefined region of volatile memory a next set of D*N XOR signatures for data stored in the next string of the respective block, in said contiguous set of W word lines.

3. The method of claim 1, wherein
the contiguous set of W word lines is a first contiguous set of W word lines in the plurality of word lines, and the plurality of word lines includes a second contiguous set of W word lines adjacent the first contiguous set of W word lines;
the subset of the respective string in a respective block is a first subset, and a second subset of the respective string in the respective block corresponds to the second contiguous set of W word lines; and
the method further comprises programming data in the second subset of the respective string in the respective block of the non-volatile three dimensional memory after programming data in the first subset of the respective string in the respective block and programming data in a respective first subset of at least one string, other than the respective string, of the respective block.

4. The method of claim 3, wherein
the D*N XOR signatures stored in the assigned portion of non-volatile memory comprise a first set of D*N XOR signatures for the respective string of the respective block; and
the method further comprises:
in response to detecting a short between a first word line of the second contiguous set of W word lines and a last word line of the first contiguous set of W word lines, retrieving at least 1N of the first set of D*N XOR signatures from the assigned portion of non-volatile memory; and
generating, using the retrieved at least 1N XOR signatures, recovery data corresponding to N pages of data programmed in non-volatile memory cells on the last word line of the first subset of the respective string.

5. The method of claim 4, wherein
programming data in the second subset of the respective string in the respective block of the non-volatile three dimensional memory includes generating in the predefined region of volatile memory a second set of D*N XOR signatures, each generated by performing an accumulated XOR operation on W/D pages of the W*N pages programmed in non-volatile memory cells on the second contiguous set of W word lines; and
the method further comprises:

in response to detecting the short between the first word line of the second contiguous set of W word lines and the last word line of the first contiguous set of W word lines, generating, using at least 1N of the second set of D*N XOR signatures, recovery data corresponding to N pages of data programmed on the first word line of the second subset of the respective string.

6. The method of claim 1, wherein
the respective block contains a plurality of rows of subblocks, each row having S subblocks where S is a number of strings in the respective block and the S subblocks of the row have a predefined order in which the subblocks are programmed with data, each row of the plurality of rows including a contiguous subset of the plurality of word lines in the respective block that is distinct from the contiguous subset of the plurality of word lines in every other row of the plurality of rows; and wherein at least two rows of the plurality of rows each includes at least four word lines of the plurality of word lines in the respective block; and
the method further comprises:
successively programming data in individual rows of the plurality of rows of the respective block, wherein the programming of data in each row is completed prior to programming data in a next row of the plurality of rows of the respective block;
wherein programming data in a respective row of the respective block comprises successively programming data in individual subblocks of the S subblocks of a respective row, in the predefined order; and
while programming data in each individual subblock of the S subblocks of the respective row, generating D*N XOR signatures, each XOR signature generated by performing an accumulated XOR operation on a predefined set of pages in the individual subblock, and in conjunction with completing the programming of data in the individual subblock, storing the D*N XOR signatures in an assigned portion of non-volatile memory.

7. A storage device, comprising:
non-volatile memory, including a non-volatile three dimensional memory having a plurality of blocks;
one or more processors; and
controller memory storing one or more programs, which when executed by the one or more processors cause the storage device to perform operations comprising:
programming data in a subset of a respective string in a respective block of the non-volatile three dimensional memory by performing a set of operations comprising:
programming a plurality of pages of data in non-volatile memory cells on each word line, in the respective string, in a contiguous set of W word lines in a plurality of word lines of the respective block, including programming N pages of data in the non-volatile memory cells on each word line in the contiguous set of W word lines, where N is a positive integer greater than 1, W is a number of word lines in the contiguous set of W word lines, and W has a value greater than 3;
in conjunction with programming W*N pages of data in non-volatile memory cells on the contiguous set of W word lines, generating in a predefined region of volatile memory D*N XOR signatures, each generated by performing an accumulated XOR operation on W/D pages of the W*N pages programmed in the non-volatile memory cells on the contiguous set of W word lines, wherein D is a positive integer greater than 1; and
prior to programming data in any string, other than the respective string, of the respective block,
in response to detecting a short between D word lines in the contiguous set of W word lines, generating, using the D*N XOR signatures, recovery data corresponding to D*N pages of data programmed on the D word lines; and
storing the D*N XOR signatures in an assigned portion of the non-volatile three dimensional memory that is distinct from the respective block of the non-volatile three dimensional memory.

8. The storage device of claim 7, wherein the one or more programs further include instructions, which when executed by the one or more processors cause the storage device to further perform operations comprising:
prior to programming data in any string, other than the respective string, of the respective block, erasing the D*N XOR signatures in the predefined region of volatile memory; and
while programming W*N pages of data in a next string of the respective block, in said contiguous set of W word lines, generating in the predefined region of volatile memory a next set of D*N XOR signatures for data stored in the next string of the respective block, in said contiguous set of W word lines.

9. The storage device of claim 7, wherein
the contiguous set of W word lines is a first contiguous set of W word lines in the plurality of word lines, and the plurality of word lines includes a second contiguous set of W word lines adjacent the first contiguous set of W word lines;
the subset of the respective string in a respective block is a first subset, and a second subset of the respective string in the respective block corresponds to the second contiguous set of W word lines;
the one or more programs further include instructions, which when executed by the one or more processors cause the storage device to further perform operations comprising: programming data in the second subset of the respective string in the respective block of the non-volatile three dimensional memory after programming data in the first subset of the respective string in the respective block and programming data in a respective first subset of at least one string, other than the respective string, of the respective block.

10. The storage device of claim 9, wherein
the D*N XOR signatures stored in the assigned portion of non-volatile memory comprise a first set of D*N XOR signatures for the respective string of the respective block; and
the one or more programs further include instructions, which when executed by the one or more processors cause the storage device to further perform operations comprising:
in response to detecting a short between a first word line of the second contiguous set of W word lines and a last word line of the first contiguous set of W word lines, retrieving at least 1N of the first set of D*N XOR signatures from the assigned portion of non-volatile memory; and
generating, using the retrieved at least 1N XOR signatures, recovery data corresponding to N pages of data programmed in non-volatile memory cells on the last word line of the first subset of the respective string.

11. The storage device of claim 10, wherein
programming data in the second subset of the respective string in the respective block of the non-volatile three dimensional memory includes generating in the predefined region of volatile memory a second set of D*N XOR signatures, each generated by performing an accumulated XOR operation on W/D pages of the W*N pages programmed in non-volatile memory cells on the second contiguous set of W word lines; and
the one or more programs further include instructions, which when executed by the one or more processors cause the storage device to further perform operations comprising:
in response to detecting the short between the first word line of the second contiguous set of W word lines and the last word line of the first contiguous set of W word lines, generating, using at least 1N of the second set of D*N XOR signatures, recovery data corresponding to N pages of data programmed on the first word line of the second subset of the respective string.

12. The storage device of claim 7, wherein
the respective block contains a plurality of rows of subblocks, each row having S subblocks where S is a number of strings in the respective block and the S subblocks of the row have a predefined order in which the subblocks are programmed with data, each row of the plurality of rows including a contiguous subset of the plurality of word lines in the respective block that is distinct from the contiguous subset of the plurality of word lines in every other row of the plurality of rows; and wherein at least two rows of the plurality of rows each includes at least four word lines of the plurality of word lines in the respective block;
the one or more programs further include instructions, which when executed by the one or more processors cause the storage device to further perform operations comprising:
successively programming data in individual rows of the plurality of rows of the respective block, wherein the programming of data in each row is completed prior to programming data in a next row of the plurality of rows of the respective block;
wherein programming data in a respective row of the respective block comprises successively programming data in individual subblocks of the S subblocks of a respective row, in the predefined order; and
while programming data in each individual subblock of the S subblocks of the respective row, generating D*N XOR signatures, each XOR signature generated by performing an accumulated XOR operation on a predefined set of pages in the individual subblock, and in conjunction with completing the programming of data in the individual subblock, storing the D*N XOR signatures in an assigned portion of non-volatile memory.

13. A non-transitory computer readable storage medium, storing one or more programs configured for execution by one or more processors of a storage device having non-volatile memory, including a non-volatile three dimensional memory having a plurality of blocks, the one or more programs including instructions for:
programming data in a subset of a respective string in a respective block of the non-volatile three dimensional memory by performing a set of operations comprising:
programming a plurality of pages of data in non-volatile memory cells on each word line, in the respective string, in a contiguous set of W word lines in a plurality of word lines of the respective block, including programming N pages of data in the non-volatile memory cells on each word line in the contiguous set of W word lines, where N is a positive integer greater than 1, W is a number of word lines in the contiguous set of W word lines, and W has a value greater than 3;
in conjunction with programming W*N pages of data in non-volatile memory cells on the contiguous set of W word lines, generating in a predefined region of volatile memory D*N XOR signatures, each generated by performing an accumulated XOR operation on W/D pages of the W*N pages programmed in the non-volatile memory cells on the contiguous set of W word lines, wherein D is a positive integer greater than 1; and
prior to programming data in any string, other than the respective string, of the respective block,
in response to detecting a short between D word lines in the contiguous set of W word lines, generating, using the D*N XOR signatures, recovery data corresponding to D*N pages of data programmed on the D word lines; and
storing the D*N XOR signatures in an assigned portion of the non-volatile three dimensional memory that is distinct from the respective block of the non-volatile three dimensional memory.

14. The non-transitory computer readable storage medium of claim 13, wherein the one or more programs include instructions for:
prior to programming data in any string, other than the respective string, of the respective block, erasing the D*N XOR signatures in the predefined region of volatile memory; and
while programming W*N pages of data in a next string of the respective block, in said contiguous set of W word lines, generating in the predefined region of volatile memory a next set of D*N XOR signatures for data stored in the next string of the respective block, in said contiguous set of W word lines.

15. The non-transitory computer readable storage medium of claim 13, wherein
the contiguous set of W word lines is a first contiguous set of W word lines in the plurality of word lines, and the plurality of word lines includes a second contiguous set of W word lines adjacent the first contiguous set of W word lines;
the subset of the respective string in a respective block is a first subset, and a second subset of the respective string in the respective block corresponds to the second contiguous set of W word lines;
the one or more programs further include instructions, which when executed by the one or more processors cause the storage device to further perform operations comprising: programming data in the second subset of the respective string in the respective block of the non-volatile three dimensional memory after programming data in the first subset of the respective string in the respective block and programming data in a respective first subset of at least one string, other than the respective string, of the respective block.

16. The non-transitory computer readable storage medium of claim 15, wherein the D*N XOR signatures stored in the assigned portion of non-volatile memory comprise a first set of D*N XOR signatures for the respective string of the respective block; and the one or more programs further include instructions, which when executed by the one or more processors cause the storage device to further perform operations comprising:

in response to detecting a short between a first word line of the second contiguous set of W word lines and a last word line of the first contiguous set of W word lines,
 retrieving at least 1N of the first set of D*N XOR signatures from the assigned portion of non-volatile memory; and
 generating, using the retrieved at least 1N XOR signatures, recovery data corresponding to N pages of data programmed in non-volatile memory cells on the last word line of the first subset of the respective string.

17. The non-transitory computer readable storage medium of claim 16, wherein programming data in the second subset of the respective string in the respective block of the non-volatile three dimensional memory includes generating in the predefined region of volatile memory a second set of D*N XOR signatures, each generated by performing an accumulated XOR operation on W/D pages of the W*N pages programmed in non-volatile memory cells on the second contiguous set of W word lines; and the one or more programs further include instructions, which when executed by the one or more processors cause the storage device to further perform operations comprising:

in response to detecting the short between the first word line of the second contiguous set of W word lines and the last word line of the first contiguous set of W word lines, generating, using at least 1N of the second set of D*N XOR signatures, recovery data corresponding to N pages of data programmed on the first word line of the second subset of the respective string.

18. The non-transitory computer readable storage medium of claim 13, wherein the respective block contains a plurality of rows of subblocks, each row having S subblocks where S is a number of strings in the respective block and the S subblocks of the row have a predefined order in which the subblocks are programmed with data, each row of the plurality of rows including a contiguous subset of the plurality of word lines in the respective block that is distinct from the contiguous subset of the plurality of word lines in every other row of the plurality of rows; and wherein at least two rows of the plurality of rows each includes at least four word lines of the plurality of word lines in the respective block;

the one or more programs further include instructions, which when executed by the one or more processors cause the storage device to further perform operations comprising:

successively programming data in individual rows of the plurality of rows of the respective block, wherein the programming of data in each row is completed prior to programming data in a next row of the plurality of rows of the respective block;

wherein programming data in a respective row of the respective block comprises successively programming data in individual subblocks of the S subblocks of a respective row, in the predefined order; and while programming data in each individual subblock of the S subblocks of the respective row, generating D*N XOR signatures, each XOR signature generated by performing an accumulated XOR operation on a predefined set of pages in the individual subblock, and in conjunction with completing the programming of data in the individual subblock, storing the D*N XOR signatures in an assigned portion of non-volatile memory.

* * * * *